United States Patent
Han

(10) Patent No.: US 12,034,030 B2
(45) Date of Patent: Jul. 9, 2024

(54) BACKSIDE ILLUMINATED IMAGE SENSOR AND METHOD OF MANUFACTURING THE SAME

(71) Applicant: DB HITEK CO., LTD., Seoul (KR)

(72) Inventor: Chang Hun Han, Gyeonggi-do (KR)

(73) Assignee: DB HITEK CO., LTD., Seoul (KR)

( * ) Notice: Subject to any disclaimer, the term of this patent is extended or adjusted under 35 U.S.C. 154(b) by 379 days.

(21) Appl. No.: 17/461,047

(22) Filed: Aug. 30, 2021

(65) Prior Publication Data

US 2022/0068985 A1 Mar. 3, 2022

(30) Foreign Application Priority Data

Aug. 31, 2020 (KR) ........................ 10-2020-0109974

(51) Int. Cl.
*H01L 27/146* (2006.01)

(52) U.S. Cl.
CPC .... *H01L 27/1464* (2013.01); *H01L 27/14621* (2013.01); *H01L 27/14627* (2013.01); *H01L 27/14636* (2013.01); *H01L 27/14685* (2013.01)

(58) Field of Classification Search
CPC ...... H01L 27/1464; H01L 22/32; H01L 24/05
See application file for complete search history.

(56) References Cited

U.S. PATENT DOCUMENTS

| | | | |
|---|---|---|---|
| 2010/0237452 A1* | 9/2010 | Hagiwara | H01L 27/1464 257/E31.127 |
| 2011/0024744 A1* | 2/2011 | Fereyre | H01L 27/1464 257/E23.001 |
| 2021/0257266 A1* | 8/2021 | Oh | G01R 31/31717 |
| 2022/0005775 A1* | 1/2022 | Sheng | H01L 22/32 |
| 2022/0068985 A1* | 3/2022 | Han | H01L 27/1464 |
| 2023/0060208 A1* | 3/2023 | Chang | H01L 24/13 |
| 2023/0141463 A1* | 5/2023 | Huang | G02F 1/13338 345/174 |
| 2023/0177300 A1* | 6/2023 | Lee | G06K 19/0718 438/106 |
| 2023/0395440 A1* | 12/2023 | Zhan | B23K 26/0006 |
| 2024/0030074 A1* | 1/2024 | Kim | H01L 24/06 |
| 2024/0128236 A1* | 4/2024 | Kim | H01L 25/0657 |

* cited by examiner

*Primary Examiner* — Mounir S Amer
*Assistant Examiner* — Alexander Belousov
(74) *Attorney, Agent, or Firm* — Husch Blackwell LLP

(57) ABSTRACT

A backside illuminated image sensor and a method of manufacturing the same are disclosed. The backside illuminated image sensor includes a substrate having a frontside surface and a backside surface, pixel regions disposed in the substrate, an insulating layer disposed on the frontside surface of the substrate, a bonding pad disposed on a frontside surface of the insulating layer, a second bonding pad connected to a backside surface of the bonding pad through the substrate and the insulating layer and exposed through the backside surface of the substrate, and a test pad connected to the backside surface of the bonding pad through the substrate and the insulating layer, exposed through the backside surface of the substrate, and for testing whether the second bonding pad is normally connected to the backside surface of the bonding pad.

10 Claims, 19 Drawing Sheets

BACKSIDE ILLUMINATED IMAGE SENSOR AND METHOD OF MANUFACTURING THE SAME

CROSS-REFERENCE TO RELATED APPLICATION

This application claims the priority benefit of Korean Patent Application No. 10-2020-0109974, filed on Aug. 31, 2020, and all the benefits accruing therefrom under 35 U.S.C. § 119, the contents of which are incorporated by reference in their entirety.

BACKGROUND

The present disclosure relates to a backside illuminated image sensor and a method of manufacturing the same. More specifically, the present disclosure relates to a backside illuminated image sensor including a color filter layer and a microlens array on a backside surface of a substrate, and a method of manufacturing the backside illuminated image sensor.

In general, an image sensor is a semiconductor device that converts an optical image into electrical signals, and may be classified or categorized as a Charge Coupled Device (CCD) or a Complementary Metal Oxide Semiconductor (CMOS) Image Sensor (CIS).

The CIS includes unit pixels, each including a photodiode and MOS transistors. The CIS sequentially detects the electrical signals of the unit pixels using a switching method, thereby forming an image. The CIS may be classified as either a frontside illuminated image sensor or a backside illuminated image sensor.

The backside illuminated image sensor may include pixel regions in a substrate, transistors formed on a frontside surface of the substrate, an insulating layer formed on the transistors, bonding pads on the insulating layer, an anti-reflective layer formed on a backside surface of the substrate, a light-blocking pattern layer formed on the anti-reflective layer, a color filter layer formed on the anti-reflective layer and the light-blocking pattern layer, and a microlens array formed on the color filter layer.

Second bonding pads connected to the bonding pads through the anti-reflective layer, the substrate, and the insulating layer may be formed on the anti-reflective layer, and third bonding pads may be formed on the second bonding pads. Further, wires may be bonded on the third bonding pads or solder bumps may be formed on the third bonding pads.

The color filter layer may include red filters, blue filters and green filters. Each of the filters may be formed by forming a photoresist layer having a color on the anti-reflective layer and the light-blocking pattern layer and then performing a photolithography process. The photoresist layer may be formed by a spin coating process, and stripe defects may occur in the photoresist layer by the second and third bonding pads during the spin coating process.

The second bonding pads may be connected to the bonding pads through contact holes formed through the anti-reflective layer, the substrate and the insulating layer. The contact holes may be formed through an anisotropic etching process after forming the anti-reflective layer on the backside surface of the substrate. However, when the depth of the contact holes is not sufficient, the second bonding pads may not be electrically connected to the bonding pads. Accordingly, there is a need for a method capable of checking whether the second bonding pads are normally connected to the bonding pads.

SUMMARY

The present disclosure provides a backside illuminated image sensor having an improved structure to solve the above problems and a method of manufacturing the backside illuminated image sensor.

In accordance with an aspect of the present disclosure, a backside illuminated image sensor may include a substrate having a frontside surface and a backside surface, pixel regions disposed in the substrate, an insulating layer disposed on the frontside surface of the substrate, a bonding pad disposed on a frontside surface of the insulating layer, a second bonding pad connected to a backside surface of the bonding pad through the substrate and the insulating layer and exposed through the backside surface of the substrate, and a test pad connected to the backside surface of the bonding pad through the substrate and the insulating layer, exposed through the backside surface of the substrate, and for testing whether the second bonding pad is normally connected to the backside surface of the bonding pad.

In accordance with some embodiments of the present disclosure, the substrate may have a first recess and a second recess formed in backside surface portions of the substrate. The second bonding pad may be connected to the backside surface of the bonding pad through a bottom surface portion of the first recess, and the test pad may be connected to the backside surface of the bonding pad through a bottom surface portion of the second recess.

In accordance with some embodiments of the present disclosure, the backside illuminated image sensor may further include an anti-reflective layer formed on the backside surface of the substrate, a bottom surface and an inner side surface of the first recess, and a bottom surface and an inner side surface of the second recess.

In accordance with some embodiments of the present disclosure, the second bonding pad may be connected to the bonding pad through a first contact hole exposing a first portion of the backside surface of the bonding pad through the anti-reflective layer, the substrate, and the insulating layer, and the test pad may be connected to the bonding pad through a second contact hole exposing a second portion of the backside surface of the bonding pad through the anti-reflective layer, the substrate, and the insulating layer.

In accordance with some embodiments of the present disclosure, the second bonding pad may be formed with a predetermined constant thickness on the anti-reflective layer, an inner side surface of the first contact hole, and the first portion of the backside surface of the bonding pad, and the test pad may be formed with a predetermined constant thickness on the anti-reflective layer, an inner side surface of the second contact hole, and the second portion of the backside surface of the bonding pad.

In accordance with some embodiments of the present disclosure, the backside illuminated image sensor may further include a third bonding pad formed in the second bonding pad and a second test pad formed in the test pad.

In accordance with some embodiments of the present disclosure, the thickness of the test pad may be the same as the thickness of the second bonding pad.

In accordance with some embodiments of the present disclosure, the backside illuminated image sensor may further include a light-blocking pattern layer formed on the anti-reflective layer and having openings corresponding to the pixel regions, respectively. In this case, the light-blocking pattern layer may have the same thickness as the second bonding pad.

In accordance with some embodiments of the present disclosure, the backside illuminated image sensor may further include a third bonding pad formed on the second bonding pad to fill an inside of the second bonding pad, and a second test pad formed on the test pad to fill an inside of the test pad. In this case, when the backside surface of the substrate faces upward, an upper surface of the third bonding pad and an upper surface of the second test pad may have the same height as an upper surface of the light-blocking pattern layer.

In accordance with some embodiments of the present disclosure, the substrate may include a field plate formed in a front surface portion of the substrate and made of an insulating material, and may have a first recess and a second recess formed in backside surface portions of the substrate and exposing a first portion and a second portion of a backside surface of the field plate, respectively. In this case, the second bonding pad and the test pad may pass through the first portion and the second portion of the backside surface of the field plate, respectively, and may be connected to the backside surface of the bonding pad.

In accordance with another aspect of the present disclosure, a backside illuminated image sensor may include a substrate having a frontside surface and a backside surface, pixel regions disposed in the substrate, an insulating layer disposed on the frontside surface of the substrate, a bonding pad disposed on a frontside surface of the insulating layer, a second bonding pad connected to a backside surface of the bonding pad through the substrate and the insulating layer and exposed through the backside surface of the substrate, and a test pad structure for testing whether the second bonding pad is normally connected to the backside surface of the bonding pad. Particularly, the test pad structure may include a test pad disposed on the frontside surface of the insulating layer, a second test pad connected to a backside surface of the test pad through the substrate and the insulating layer and exposed through the backside surface of the substrate, and a third test pad connected to the backside surface of the test pad through the substrate and the insulating layer and exposed through the backside surface of the substrate.

In accordance with some embodiments of the present disclosure, the substrate may have a first recess, a second recess and a third recess formed in backside surface portions of the substrate. In such case, the second bonding pad may be connected to the backside surface of the bonding pad through a bottom surface portion of the first recess, the second test pad may be connected to the backside surface of the test pad through a bottom surface portion of the second recess, and the third test pad may be connected to the backside surface of the test pad through a bottom surface portion of the third recess.

In accordance with some embodiments of the present disclosure, the backside illuminated image sensor may further include an anti-reflective layer formed on the backside surface of the substrate, a bottom surface and an inner side surface of the first recess, a bottom surface and an inner side surface of the second recess, and a bottom surface and an inner side surface of the third recess.

In accordance with some embodiments of the present disclosure, the second bonding pad may be connected to the bonding pad through a first contact hole exposing a portion of the backside surface of the bonding pad through the anti-reflective layer, the substrate, and the insulating layer.

Further, the second test pad may be connected to the test pad through a second contact hole exposing a first portion of the backside surface of the test pad through the anti-reflective layer, the substrate, and the insulating layer, and the third test pad may be connected to the test pad through a third contact hole exposing a second portion of the backside surface of the test pad through the anti-reflective layer, the substrate, and the insulating layer.

In accordance with some embodiments of the present disclosure, the second bonding pad may be formed with a predetermined constant thickness on the anti-reflective layer, an inner side surface of the first contact hole, and the portion of the backside surface of the bonding pad. Further, the second test pad may be formed with a predetermined constant thickness on the anti-reflective layer, an inner side surface of the second contact hole, and the first portion of the backside surface of the test pad, and the third test pad may be formed with a predetermined constant thickness on the anti-reflective layer, an inner side surface of the third contact hole, and the second portion of the backside surface of the test pad.

In accordance with some embodiments of the present disclosure, the backside illuminated image sensor may further include a third bonding pad formed in the second bonding pad, a fourth test pad formed in the second test pad, and a fifth test pad formed in the third test pad.

In accordance with some embodiments of the present disclosure, the thickness of the second test pad and the thickness of the third test pad may be the same as the thickness of the second bonding pad.

In accordance with some embodiments of the present disclosure, the backside illuminated image sensor may further include a light-blocking pattern layer formed on the anti-reflective layer and having openings corresponding to the pixel regions, respectively. The light-blocking pattern layer may have the same thickness as the second bonding pad.

In accordance with some embodiments of the present disclosure, the backside illuminated image sensor may further include a third bonding pad formed on the second bonding pad to fill an inside of the second bonding pad, a fourth test pad formed on the second test pad to fill an inside of the second test pad, and a fifth test pad formed on the third test pad to fill an inside of the third test pad. At this case, when the backside surface of the substrate faces upward, an upper surface of the third bonding pad, an upper surface of the fourth test pad, and an upper surface of the fifth test pad may have the same height as an upper surface of the light-blocking pattern layer.

In accordance with some embodiments of the present disclosure, the substrate may include a field plate formed in a front surface portion of the substrate and made of an insulating material, and may have a first recess, a second recess and a third recess formed in backside surface portions of the substrate and exposing a first portion, a second portion and a third portion of a backside surface of the field plate, respectively. In such case, the second bonding pad may pass through the first portion of the backside surface of the field plate and may be connected to the backside surface of the bonding pad. Further, the second test pad and the third test pad may pass through the second portion and the third portion of the backside surface of the field plate, respectively, and may be connected to the backside surface of the test pad.

In accordance with the embodiments of the present disclosure as described above, whether the second bonding pad is electrically connected to the bonding pad may be checked using the test pad or the test pad structure. For example, whether the second bonding pad is electrically connected to the bonding pad may be checked by measuring an electrical resistance between the test pad and the third bonding pad or by measuring an electrical resistance between the fourth and fifth test pads using a probe card.

Further, when the backside surface of the substrate faces upward, an upper surface of the third bonding pad may have the same height as an upper surface of the light-blocking pattern layer, and thus, stripe defects may be prevented from occurring during a spin coating process for forming a color filter layer.

The above summary of the present disclosure is not intended to describe each illustrated embodiment or every implementation of the present disclosure. The detailed description and claims that follow more particularly exemplify these embodiments.

BRIEF DESCRIPTION OF THE DRAWINGS

Embodiments can be understood in more detail from the following description taken in conjunction with the accompanying drawings, in which.

Figure 1:
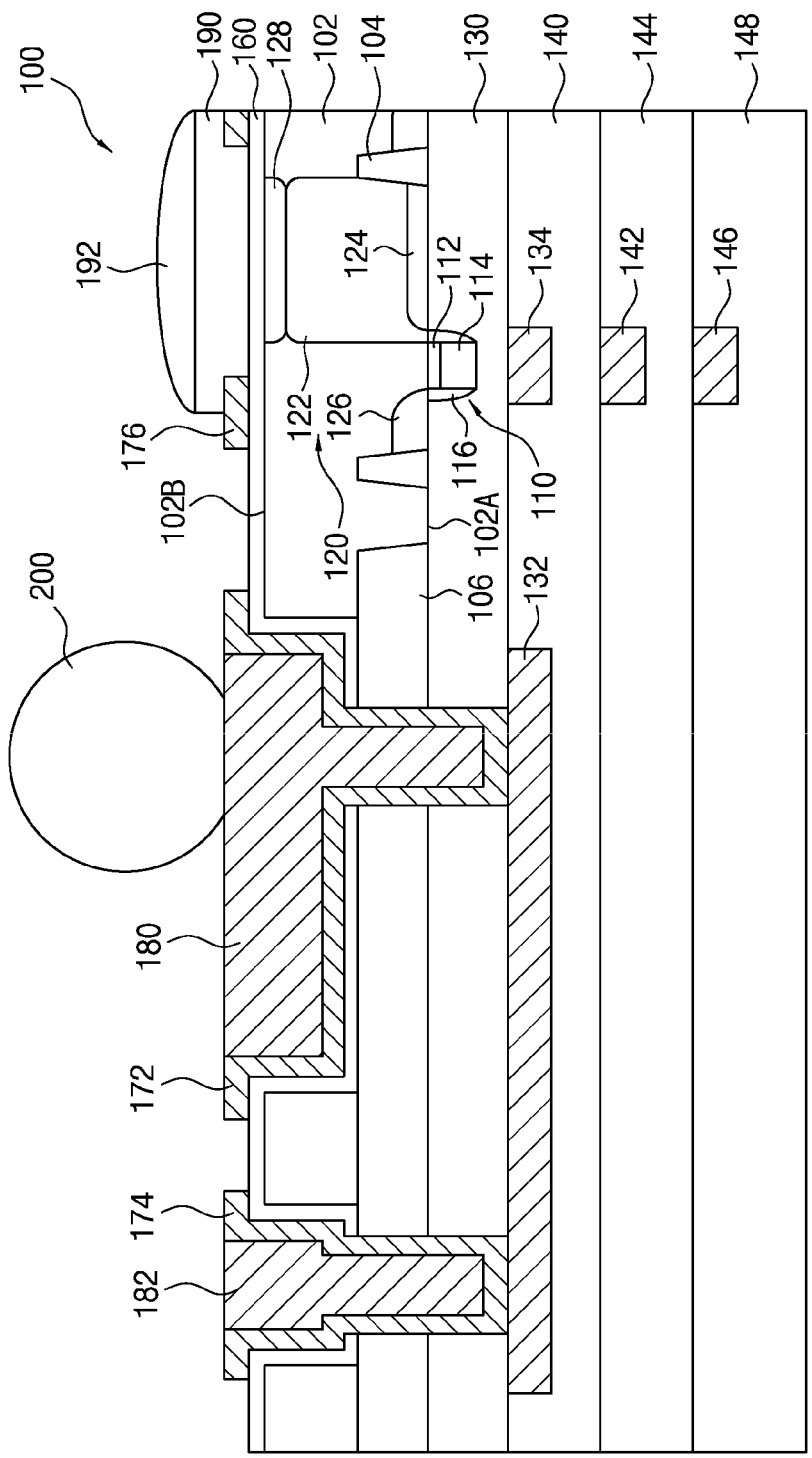
FIG. 1 is a cross-sectional view illustrating a backside illuminated image sensor in accordance with an embodiment of the present disclosure.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION

Hereinafter, embodiments of the present invention are described in more detail with reference to the accompanying drawings. However, the present invention is not limited to the embodiments described below and is implemented in various other forms. Embodiments below are not provided to fully complete the present invention but rather are provided to fully convey the range of the present invention to those skilled in the art.

In the specification, when one component is referred to as being on or connected to another component or layer, it can be directly on or connected to the other component or layer, or an intervening component or layer may also be present. Unlike this, it will be understood that when one component is referred to as directly being on or directly connected to another component or layer, it means that no intervening component is present. Also, though terms like a first, a second, and a third are used to describe various regions and layers in various embodiments of the present invention, the regions and the layers are not limited to these terms.

Terminologies used below are used to merely describe specific embodiments, but do not limit the present invention. Additionally, unless otherwise defined here, all the terms including technical or scientific terms, may have the same meaning that is generally understood by those skilled in the art.

Embodiments of the present invention are described with reference to schematic drawings of ideal embodiments. Accordingly, changes in manufacturing methods and/or allowable errors may be expected from the forms of the drawings. Accordingly, embodiments of the present invention are not described being limited to the specific forms or areas in the drawings, and include the deviations of the forms. The areas may be entirely schematic, and their forms may not describe or depict accurate forms or structures in any given area, and are not intended to limit the scope of the present invention.

FIG. 1 is a cross-sectional view illustrating a backside illuminated image sensor in accordance with an embodiment of the present disclosure.

Referring to FIG. 1, a backside illuminated image sensor 100, in accordance with an embodiment of the present disclosure, may include a substrate 102 having a frontside surface 102A and a backside surface 102B, pixel regions 120 disposed in the substrate 102, an insulating layer 130 disposed on the frontside surface 102A of the substrate 102, a bonding pad 132 disposed on a frontside surface of the insulating layer 130, a second bonding pad 172 connected to a backside surface of the bonding pad 132 through the substrate 102 and the insulating layer 130 and exposed through the backside surface 102B of the substrate 102, and a test pad 174 connected to the backside surface of the bonding pad 132 through the substrate 102 and the insulating layer 130, exposed through the backside surface 102B of the substrate 102, and for testing whether the second bonding pad 172 is normally connected to the backside surface of the bonding pad 132.

Each of the pixel regions 120 may include a charge accumulation region 122 in which charges generated by the incident light are accumulated. The charge accumulation regions 122 may be disposed in the substrate 102, and floating diffusion regions 126 may be disposed in frontside surface portions of the substrate 102 to be spaced apart from the charge accumulation regions 122.

The substrate 102 may have a first conductivity type, and the charge accumulation regions 122 and the floating diffusion regions 126 may have a second conductivity type. For example, a p-type substrate may be used as the substrate 102, and n-type impurity diffusion regions functioning as the charge accumulation regions 122 and the floating diffusion regions 126 may be formed in the p-type substrate 102. Alternatively, the substrate 102 may include a p-type epitaxial layer, and the charge accumulation regions 122 and the floating diffusion regions 126 may be formed in the p-type epitaxial layer.

Transfer gate structures 110 may be disposed on channel regions between the charge accumulation regions 122 and the floating diffusion regions 126 to transfer the charges accumulated in the charge accumulation regions 122 to the floating diffusion regions 126. Each of the transfer gate structures 110 may include a gate insulating layer 112 disposed on the frontside surface 102A of the substrate 102, a gate electrode 114 disposed on the gate insulating layer 112, and gate spacers 116 disposed on side surfaces of the gate electrode 114. Further, though not shown in FIG. 1, the backside illuminated image sensor 100 may include reset transistors, source follower transistors, and select transistors electrically connected with the floating diffusion regions 126.

Alternatively, if the backside illuminated image sensor 100 is a 3T (or fewer than three transistors) layout, the transfer gate structures 110 may be used as reset gate structures and the floating diffusion regions 126 may be used as active regions for connecting the charge accumulation regions 122 with reset circuitries.

Each of the pixel regions 120 may include a frontside pinning layer 124 disposed between the frontside surface 102A of the substrate 102 and the charge accumulation region 122. Further, each of the pixel regions 120 may include a backside pinning layer 128 disposed between the backside surface 102B of the substrate 102 and the charge accumulation region 122. The frontside and backside pinning layers 124 and 128 may have the first conductivity type. For example, p-type impurity diffusion regions may be used as the frontside and backside pinning layers 124 and 128.

A first wiring layer 134 may be disposed on the frontside surface of the insulating layer 130 and may be electrically connected with the pixel regions 120. The first wiring layer 134 may be made of the same material as the bonding pad 132.

Further, a second insulating layer 140 may be disposed on the frontside surface of the insulating layer 130, the bonding pad 132 and the first wiring layer 134, and a second wiring layer 142 may be disposed on the second insulating layer 140. A third insulating layer 144 may be disposed on the second insulating layer 140 and the second wiring layer 142, and a third wiring layer 146 may be disposed on the third insulating layer 144. A passivation layer 148 may be disposed on the third insulating layer 144 and the third wiring layer 146.

In accordance with an embodiment of the present disclosure, the substrate 102 may have a first recess 150 (refer to FIG. 8) and a second recess 152 (refer to FIG. 8) formed in backside surface portions of the substrate 102. The second bonding pad 172 may be connected to the backside surface of the bonding pad 132 through a bottom surface portion of the first recess 150, and the test pad 174 may be connected to the backside surface of the bonding pad 132 through a bottom surface portion of the second recess 152.

An anti-reflective layer 160 may be formed on the backside surface 102B of the substrate 102, a bottom surface and an inner side surface of the first recess 150, and a bottom surface and an inner side surface of the second recess 152. For example, though not shown in FIG. 1, the anti-reflective layer 160 may include a metal oxide layer formed on the backside surface 102B of the substrate 102, a silicon oxide layer formed on the metal oxide layer, and a silicon nitride layer formed on the silicon oxide layer.

The second bonding pad 172 may be connected to the bonding pad 132 through a first contact hole 162 (refer to FIG. 10) exposing a first portion 132A (refer to FIG. 10) of the backside surface of the bonding pad 132 through the anti-reflective layer 160, the substrate 102 and the insulating layer 130, and the test pad 174 may be connected to the bonding pad 132 through a second contact hole 164 (refer to FIG. 10) exposing a second portion 132B (refer to FIG. 10) of the backside surface of the bonding pad 132 through the anti-reflective layer 160, the substrate 102 and the insulating layer 130.

The second bonding pad 172 may be formed with a predetermined constant thickness on the anti-reflective layer 160, an inner side surface of the first contact hole 162, and the first portion 132A of the backside surface of the bonding pad 132, and the test pad 174 may be formed with a predetermined constant thickness on the anti-reflective layer 160, an inner side surface of the second contact hole 164, and the second portion 132B of the backside surface of the bonding pad 132. Particularly, the first contact hole 162 and the second contact hole 164 may be simultaneously formed by an anisotropic etching process, and the second bonding pad 172 and the test pad 174 may be formed to have the same thickness by a chemical vapor deposition process or an atomic layer deposition process.

A third bonding pad 180 may be formed on the second bonding pad 172 to fill an inside of the second bonding pad 172, and a second test pad 182 may be formed on the test pad 174 to fill an inside of the test pad 174. Whether the second bonding pad 172 is normally connected to the bonding pad 132 may be inspected through an inspection process using a probe card. For example, whether the second bonding pad 172 is normally connected to the bonding pad 132 may be inspected by measuring an electrical resistance between the third bonding pad 180 and the second test pad 182 using probes of the probe card.

In accordance with an embodiment of the present disclosure, the backside illuminated image sensor 100 may include a field plate 106 formed in a front surface portion of the substrate 102 and made of an insulating material. In such case, the first recess 150 and the second recess 152 may expose a first portion 106A (refer to FIG. 8) and a second portion 106B (refer to FIG. 8) of a backside surface of the field plate 106, respectively. Further, the anti-reflective layer 160 may be formed on the backside surface 102B of the substrate 102, inner side surfaces of the first recess 150 and the second recess 152, and the first portion 106A and the second portion 106B of the backside surface of the field plate 106. The first contact hole 162 and the second contact hole 164 may be formed to pass through the anti-reflective layer 160, the field plate 106, and the insulating layer 130. That is, the second bonding pad 172 and the test pad 174 may pass through the first portion 106A and the second portion 106B of the backside surface of the field plate 106, respectively, and may be connected to the backside surface of the bonding pad 132.

In accordance with an embodiment of the present disclosure, an edge portion of the second bonding pad 172 and an edge portion of the test pad 174 may be formed on the backside surface 102B of the substrate 102. Further, a light-blocking pattern layer 176 having openings 178 (refer to FIG. 12) corresponding to the pixel regions 120, respectively, may be formed on the anti-reflective layer 160. Particularly, the light-blocking pattern layer 176 may be simultaneously formed of the same material as the second bonding pad 172 and the test pad 174, and may have the same thickness as the second bonding pad 172 and the test pad 174. Further, when the backside surface 102B of the substrate 102 faces upward as shown in FIG. 1, an upper surface of the third bonding pad 180 and an upper surface of the second test pad 182 may have the same height as an upper surface of the light-blocking pattern layer 176. That is, a backside surface of the third bonding pad 180 and a backside surface of the second test pad 182 may have the same height as a backside surface of the light-blocking pattern layer 176.

A color filter layer 190 may be formed on the anti-reflective layer 160 and the light-blocking pattern layer 176, and a microlens array 192 may be formed on the color filter layer 190. In addition, a solder bump 200 may be formed on the third bonding pad 180. Alternatively, a wire may be bonded on the third bonding pad 180 by a wire bonding process. As still another example, although not shown, a planarization layer (not shown) may be formed on the anti-reflective layer 160 and the light-blocking pattern layer 176. In this case, the color filter layer 190 and the microlens array 192 may be formed on the planarization layer.

The color filter layer 190 may include red filters, green filters and blue filters. Each of the filters may be formed by forming a photoresist layer having a color on the anti-reflective layer 160 and the light-blocking pattern layer 176 through a spin coating process and then performing a photolithography process. In accordance with an embodiment of the present disclosure, the backside surfaces of the light-blocking pattern layer 176, the third bonding pad 180 and the second test pad 182 may all have the same height, and thus stripe defects may be prevented from occurring during the spin coating process for forming the filters.

Figure 2:
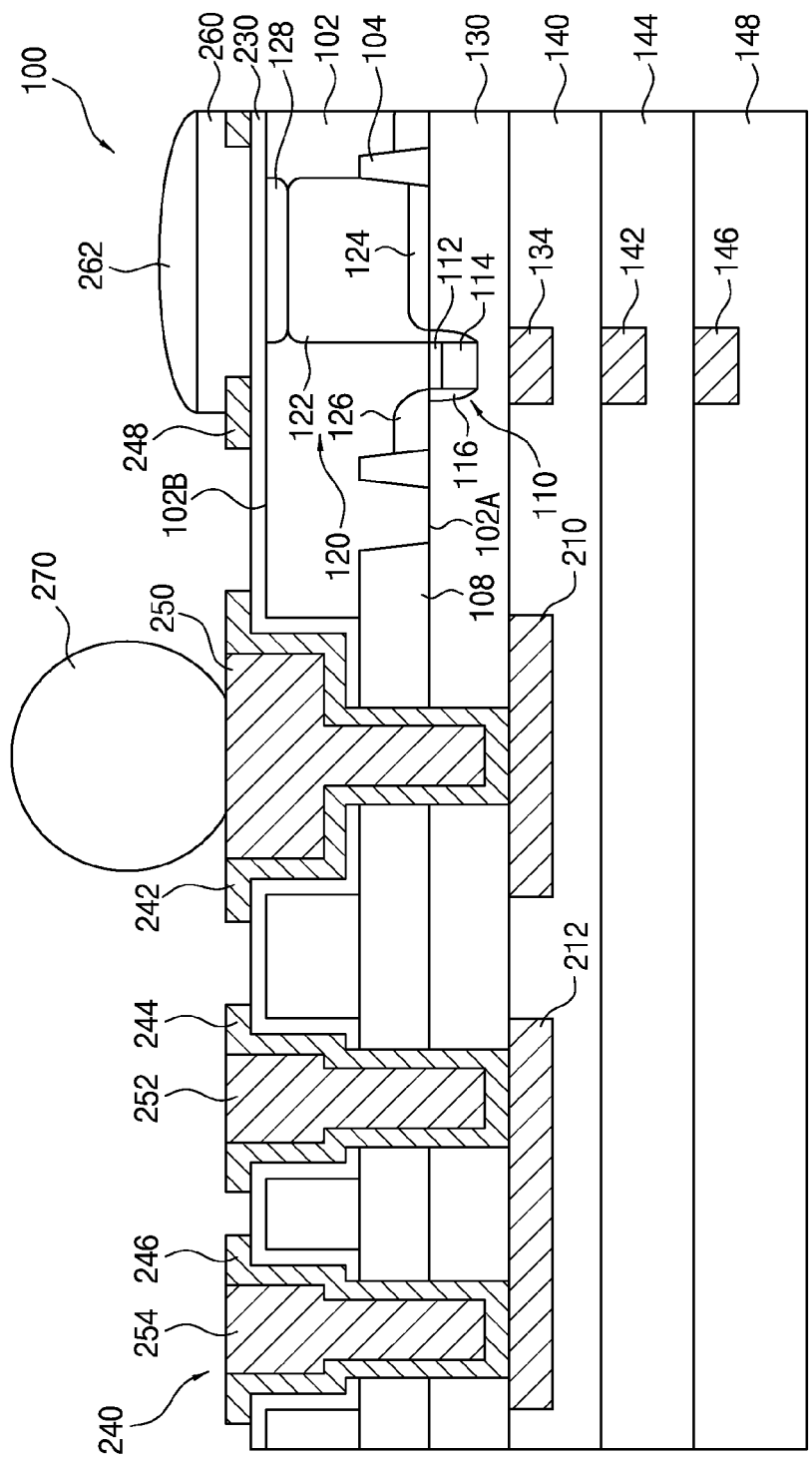
FIG. 2 is a cross-sectional view illustrating a backside illuminated image sensor in accordance with another embodiment of the present disclosure.

FIG. 2 is a cross-sectional view illustrating a backside illuminated image sensor in accordance with another embodiment of the present disclosure.

Referring to FIG. 2, the backside illuminated image sensor 100, in accordance with another embodiment of the present disclosure, may include a substrate 102 having a frontside surface 102A and a backside surface 102B, pixel regions 120 disposed in the substrate 102, an insulating layer 130 disposed on the frontside surface 102A of the substrate 102, a bonding pad 210 disposed on a frontside surface of the insulating layer 130, a second bonding pad 242 connected to a backside surface of the bonding pad 210 through the substrate 102 and the insulating layer 130 and exposed through the backside surface 102B of the substrate 102, and a test pad structure 240 for testing whether the second bonding pad 242 is normally connected to the backside surface of the bonding pad 210. Particularly, the test pad structure 240 may include a test pad 212 disposed on the frontside surface of the insulating layer 130, a second test pad 244 connected to a backside surface of the test pad 212 through the substrate 102 and the insulating layer 130 and exposed through the backside surface 102B of the substrate 102, and a third test pad 246 connected to the backside surface of the test pad 212 through the substrate 102 and the insulating layer 130 and exposed through the backside surface 102B of the substrate 102.

In accordance with another embodiment of the present disclosure, the substrate 102 may have a first recess 220 (refer to FIG. 15) corresponding to the bonding pad 210, and a second recess 222 (refer to FIG. 15) and a third recess 224 (refer to FIG. 15) corresponding to the test pad 212. The first, second and third recesses 220, 222 and 224 may be formed in backside surface portions of the substrate 102. The second bonding pad 242 may be connected to the backside surface of the bonding pad 210 through a bottom surface portion of the first recess 150. The second test pad 244 may be connected to the backside surface of the test pad 212 through a bottom surface portion of the second recess 222, and the third test pad 246 may be connected to the backside surface of the test pad 212 through a bottom surface portion of the third recess 224.

An anti-reflective layer 230 may be formed on the backside surface 102B of the substrate 102, a bottom surface and an inner side surface of the first recess 220, a bottom surface and an inner side surface of the second recess 222, and a bottom surface and an inner side surface of the third recess 224. The second bonding pad 242 may be connected to the bonding pad 210 through a first contact hole 232 (refer to FIG. 17) exposing a portion 210A (refer to FIG. 17) of the backside surface of the bonding pad 210 through the anti-reflective layer 230, the substrate 102 and the insulating layer 130. The second test pad 244 may be connected to the test pad 212 through a second contact hole 234 (refer to FIG. 17) exposing a first portion 212A (refer to FIG. 17) of the backside surface of the test pad 212 through the anti-reflective layer 160, the substrate 102 and the insulating layer 130, and the third test pad 246 may be connected to the test pad 212 through a third contact hole 236 (refer to FIG. 17) exposing a second portion 212B (refer to FIG. 17) of the backside surface of the test pad 212 through the anti-reflective layer 160, the substrate 102 and the insulating layer 130.

The second bonding pad 242 may be formed with a predetermined constant thickness on the anti-reflective layer 230, an inner side surface of the first contact hole 232, and the portion 210A of the backside surface of the bonding pad 210. The second test pad 244 may be formed with a predetermined constant thickness on the anti-reflective layer 230, an inner side surface of the second contact hole 234, and the first portion 212A of the backside surface of the test pad 212. The third test pad 246 may be formed with a predetermined constant thickness on the anti-reflective layer 230, an inner side surface of the third contact hole 236, and the second portion 212B of the backside surface of the test pad 212. Particularly, the first contact hole 232, the second contact hole 234, and the third contact hole 236 may be simultaneously formed by an anisotropic etching process, and the second bonding pad 242, the second test pad 244, and the third test pad 246 may be formed to have the same thickness by a chemical vapor deposition process or an atomic layer deposition process.

A third bonding pad 250 may be formed on the second bonding pad 242 to fill an inside of the second bonding pad 242. A fourth test pad 252 may be formed on the second test pad 244 to fill an inside of the second test pad 244, and a fifth test pad 254 may be formed on the third test pad 246 to fill an inside of the third test pad 246. Whether the second bonding pad 242 is normally connected to the bonding pad 210 may be inspected through an inspection process using a probe card. For example, whether the second bonding pad 242 is normally connected to the bonding pad 210 may be inspected by measuring an electrical resistance between the fourth test pad 252 and the fifth test pad 254 using probes of the probe card.

In accordance with another embodiment of the present disclosure, the backside illuminated image sensor 100 may include a field plate 108 formed in a front surface portion of the substrate 102 and made of an insulating material. In such case, the first recess 220, the second recess 222, and the third recess 224 may expose a first portion 108A (refer to FIG. 15), a second portion 108B (refer to FIG. 15) and a third portion 108C (refer to FIG. 15) of a backside surface of the field plate 106, respectively. Further, the anti-reflective layer 230 may be formed on the backside surface 102B of the substrate 102, inner side surfaces of the first recess 220, the second recess 222 and the third recess 224, and the first portion 108A, the second portion 108B and the third portion 108C of the backside surface of the field plate 108. The first contact hole 232, the second contact hole 234 and the third contact hole 236 may be formed to pass through the anti-reflective layer 230, the field plate 106, and the insulating layer 130. That is, the second bonding pad 242 may pass through the anti-reflective layer 230, the field plate 108 and the insulating layer 130, and may be connected to the backside surface of the bonding pad 210, and the second test pad 244 and the third test pad 246 may pass through the anti-reflective layer 230, the field plate 108 and the insulating layer 130, and may be connected to the backside surface of the test pad 212.

In accordance with another embodiment of the present disclosure, an edge portion of the second bonding pad 242 and edge portions of the second and third test pads 244 and 246 may be formed on the backside surface 102B of the substrate 102. Further, a light-blocking pattern layer 248 having openings 249 (refer to FIG. 19) corresponding to the pixel regions 120, respectively, may be formed on the anti-reflective layer 230. Particularly, the light-blocking pattern layer 248 may be simultaneously formed of the same material as the second bonding pad 242 and the second and third test pads 244 and 246, and may have the same thickness as the second bonding pad 242 and the second and third test pads 244 and 246. Further, when the backside surface 102B of the substrate 102 faces upward as shown in FIG. 2, an upper surface of the third bonding pad 250 and upper surfaces of the fourth and fifth test pads 252 and 254 may have the same height as an upper surface of the light-blocking pattern layer 248. That is, a backside surface of the third bonding pad 250 and backside surfaces of the fourth and fifth test pads 252 and 254, respectively, may have the same height as a backside surface of the light-blocking pattern layer 248.

A color filter layer 260 may be formed on the anti-reflective layer 230 and the light-blocking pattern layer 248, and a microlens array 262 may be formed on the color filter layer 260. In addition, a solder bump 270 may be formed on the third bonding pad 250. Alternatively, a wire may be bonded on the third bonding pad 250 by a wire bonding process. As still another example, although not shown, a planarization layer (not shown) may be formed on the anti-reflective layer 230 and the light-blocking pattern layer 248. In this case, the color filter layer 260 and the microlens array 262 may be formed on the planarization layer.

The color filter layer 260 may include red filters, green filters and blue filters. Each of the filters may be formed by forming a photoresist layer having a color on the anti-reflective layer 230 and the light-blocking pattern layer 248 through a spin coating process and then performing a photolithography process. In accordance with another embodiment of the present disclosure, the backside surfaces of the light-blocking pattern layer 248, the third bonding pad 250 and the fourth and fifth test pads 252 and 254, respectively, may all have the same height, and thus stripe defects may be prevented from occurring during the spin coating process for forming the filters.

FIGS. 3 to 12 are cross-sectional views illustrating a method of manufacturing the backside illuminated image sensor as shown in FIG. 1.

Figure 3:
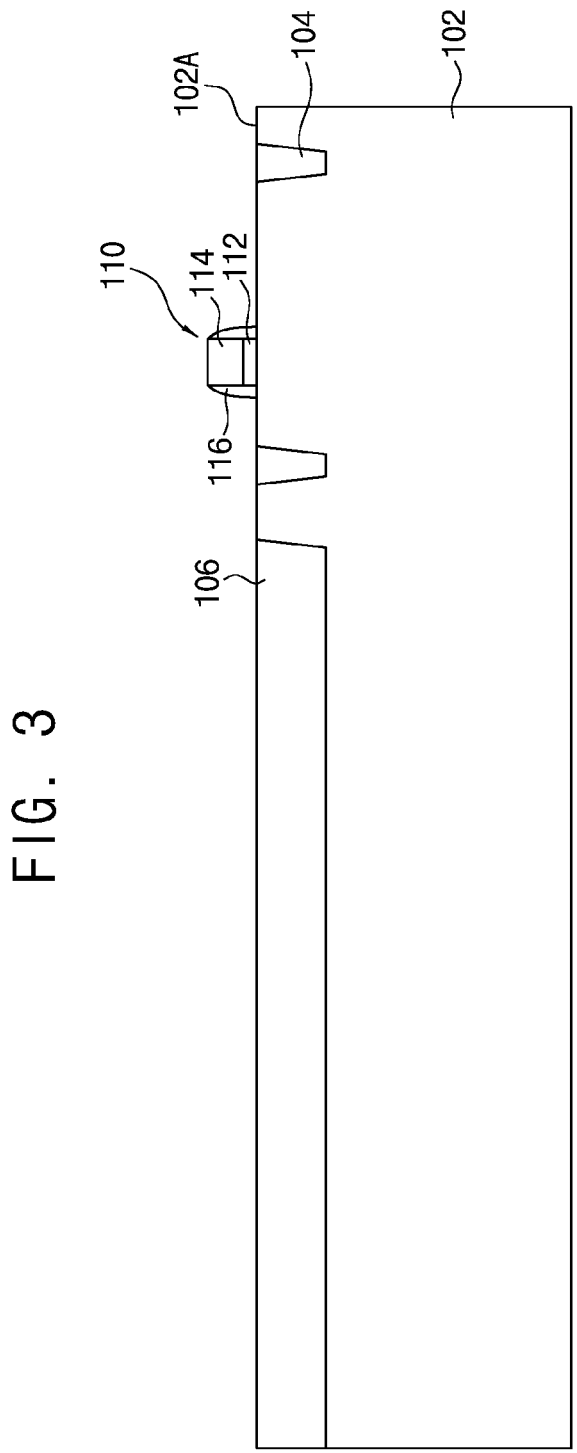
FIGS. 3 to 12 are cross-sectional views illustrating a method of manufacturing the backside illuminated image sensor as shown in FIG. 1.

Referring to FIG. 3, device isolation regions 104 may be formed in frontside surface portions of a substrate 102 to define active regions of the backside illuminated image sensor 100. The substrate 102 may have a first conductivity type. For example, a p-type substrate may be used as the substrate 102. Alternatively, the substrate 102 may include a bulk silicon substrate and a p-type epitaxial layer formed on the bulk silicon substrate. The device isolation regions 104 may be made of an insulating material such as silicon oxide and may be formed by a shallow trench isolation (STI) process. Further, a field plate 106 made of an insulating material may be formed in a frontside surface portion of the substrate 102. For example, the field plate 106 may be made of silicon oxide and may be formed simultaneously with the device isolation regions 104

After forming the device isolation regions 104 and the field plate 106, transfer gate structures 110 may be formed on a frontside surface 102A of the substrate 102. Each of the transfer gate structures 110 may include a gate insulating layer 112, a gate electrode 114 formed on the gate insulating layer 112 and gate spacers 116 formed on side surfaces of the gate electrode 114. Further, though not shown in figures, reset gate structures, source follower gate structures and select gate structures may be simultaneously formed with the transfer gate structures 110 on the frontside surface 102A of the substrate 102.

Figure 4:
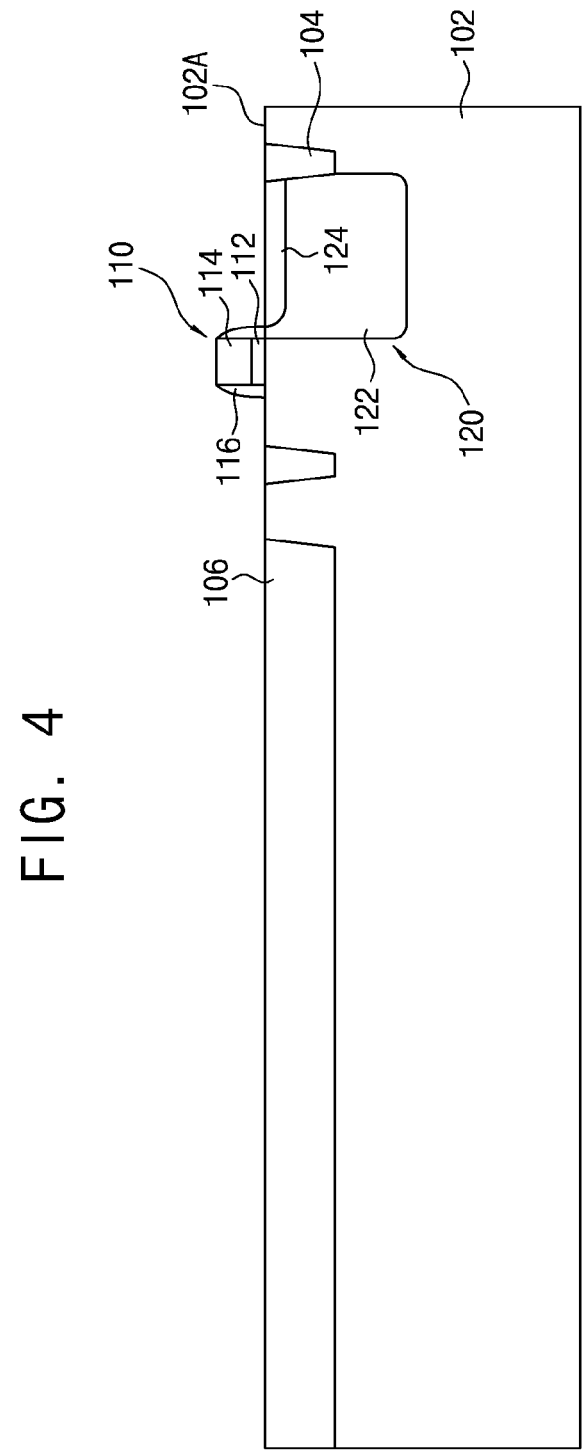

Referring to FIG. 4, charge accumulation regions 122 used as pixel regions 120 may be formed in the substrate 102. Specifically, charge accumulation regions 122 having a second conductivity type may be formed in the active regions of the substrate 102. For example, n-type charge accumulation regions 122 may be formed in the p-type substrate 102. The n-type charge accumulation regions 122 may be n-type impurity diffusion regions formed by an ion implantation process.

Then, frontside pinning layers 124 having the first conductivity type may be formed between the frontside surface 102A of the substrate 102 and the charge accumulation regions 122. For example, p-type frontside pinning layers 124 may be formed between the frontside surface 102A of the substrate 102 and the n-type charge accumulation regions 122 by an ion implantation process. The p-type frontside pinning layers 124 may be p-type impurity diffusion regions. The n-type charge accumulation regions 122 and the p-type frontside pinning layers 124 may be activated by a subsequent rapid heat treatment process.

Figure 5:
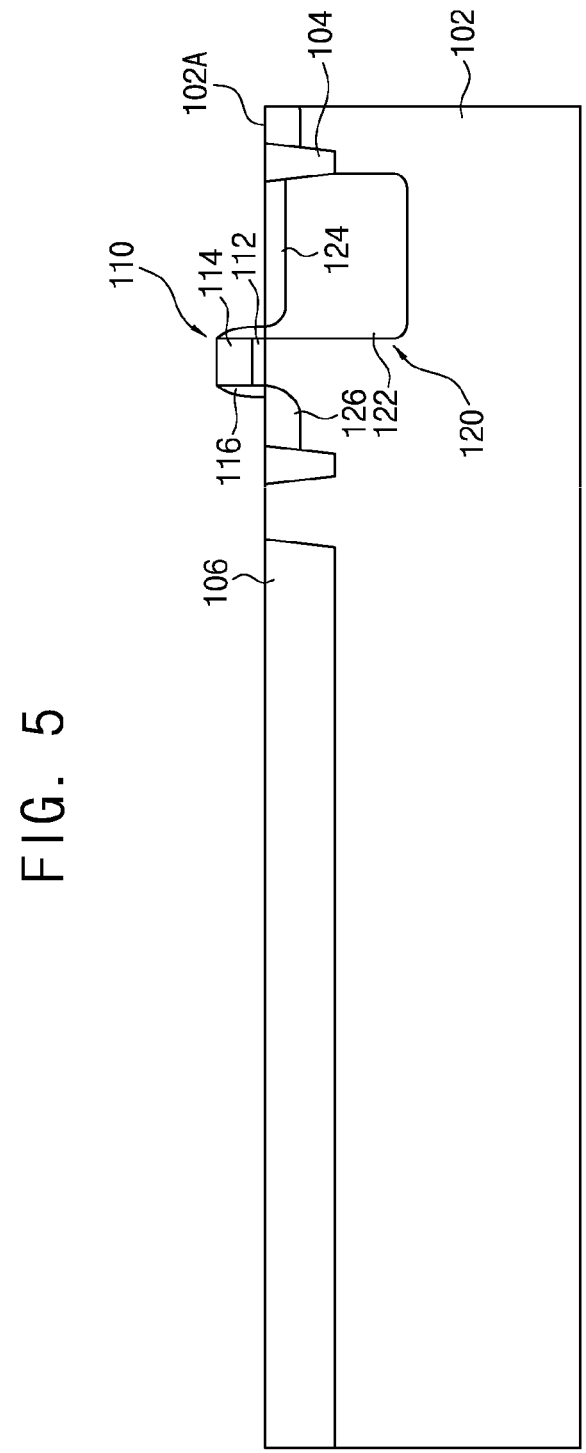

Referring to FIG. 5, floating diffusion regions 126 having the second conductivity type may be formed in frontside surface portions of the substrate 102 to be spaced apart from the charge accumulation regions 122. For example, the floating diffusion regions 126 may be n-type high concentration impurity regions, which may be formed by an ion implantation process. The transfer gate structures 110 may be arranged on channel regions between the charge accumulation regions 122 and the floating diffusion regions 126.

Figure 6:
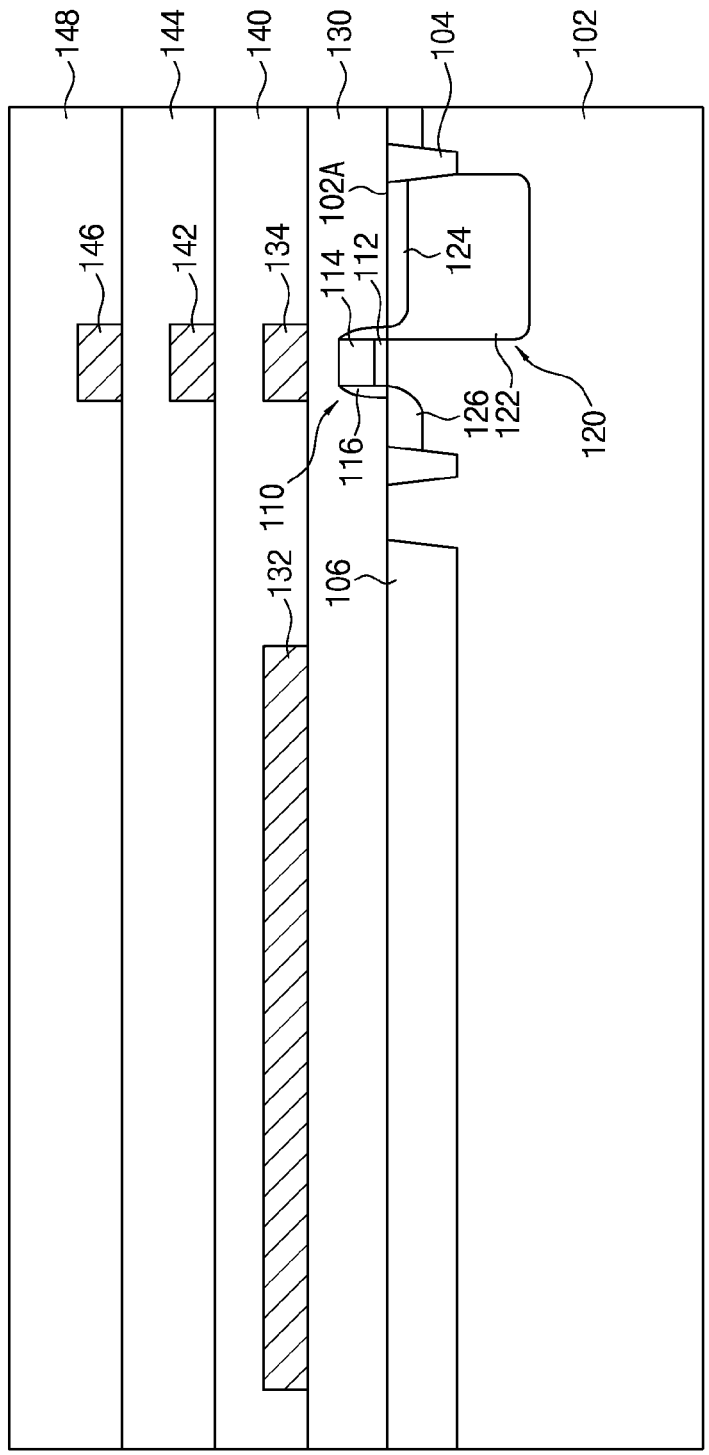

Referring to FIG. 6, an insulating layer 130 may be formed on the frontside surface 102A of the substrate 102, and a bonding pad 132 and a first wiring layer 134 may be formed on the insulating layer 130. The insulating layer 130 may be made of an insulating material such as silicon oxide, and the bonding pad 132 and the first wiring layer 134 may be made of a metallic material such as copper or aluminum. For example, after forming the insulating layer 130, a metal layer (not shown) may be formed on the insulating layer 130, and the bonding pad 132 and the first wiring layer 134 may then be formed by patterning the metal layer.

A second insulating layer 140 may be formed on the insulating layer 130, the bonding pad 132 and the first wiring layer 134, and a second wiring layer 142 may be formed on the second insulating layer 140. A third insulating layer 144 may be formed on the second insulating layer 140 and the second wiring layer 142, and a third wiring layer 146 may be formed on the third insulating layer 144. A passivation layer 148 may be formed on the third insulating layer 144 and the third wiring layer 146. The first, second and third wiring layers 134, 142 and 146 may be electrically connected with the pixel regions 120, and the bonding pad 132 may be electrically connected with the first, second and third wiring layers 134, 142 and 146.

Figure 7:
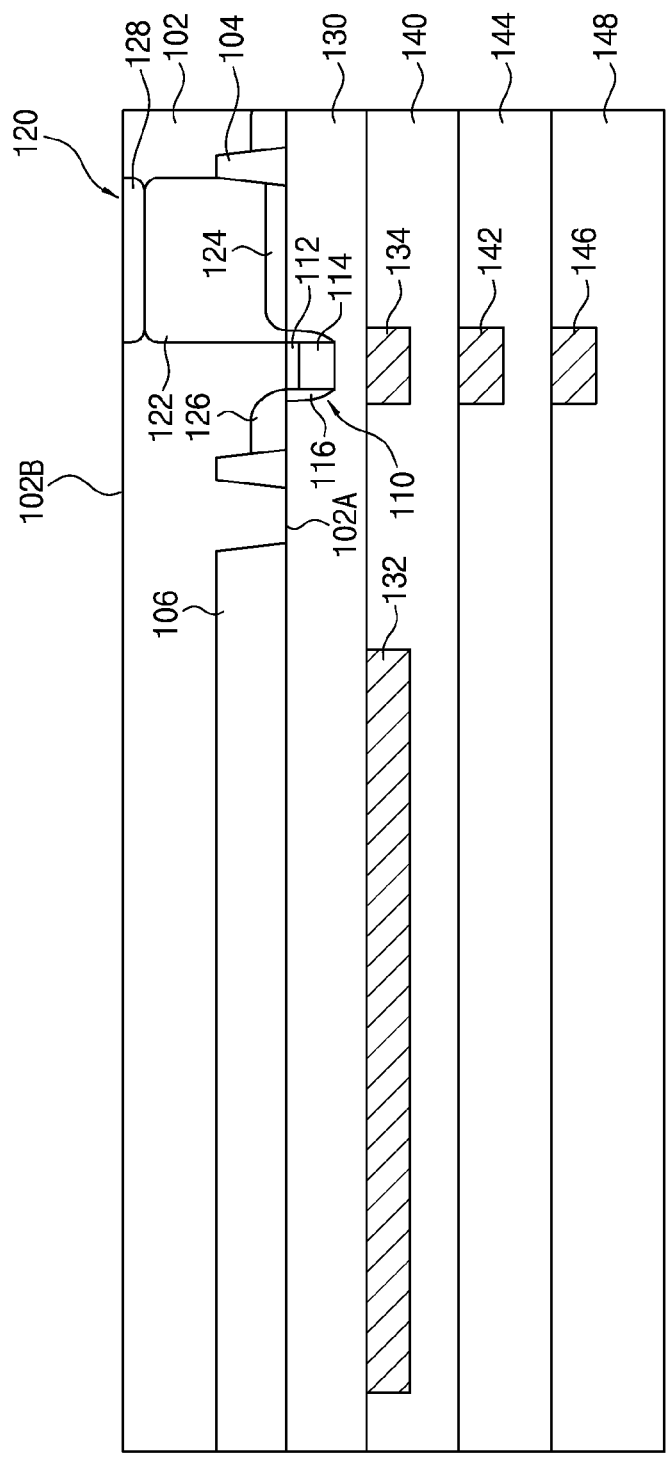

Referring to FIG. 7, a back-grinding process and/or a chemical mechanical polishing process may be performed in order to reduce a thickness of the substrate 102. Further, backside pinning layers 128 having the first conductivity type may be formed between a backside surface 102B of the substrate 102 and the charge accumulation regions 122. For example, p-type impurity regions functioning as the backside pinning layers 128 may be formed by an ion implantation process, and may then be activated by a subsequent laser annealing process.

Alternatively, the backside pinning layers 128 may be formed prior to the charge accumulation regions 122. For example, after forming the backside pinning layers 128, the charge accumulation regions 122 may be formed on the backside pinning layers 128, and the frontside pinning layers 124 may then be formed on the charge accumulation regions 122. In such case, the backside pinning layers 128 may be activated by the rapid heat treatment process along with the charge accumulation regions 122 and the frontside pinning layers 124. Further, the back-grinding process may be performed such that the backside pinning layers 128 are exposed.

Meanwhile, when the substrate 102 includes a bulk silicon substrate and a p-type epitaxial layer formed on the bulk silicon substrate, the charge accumulation regions 122 and the frontside and backside pinning layers 124 and 128 may be formed in the p-type epitaxial layer, and the bulk silicon substrate may be removed by the back-grinding process.

Figure 8:
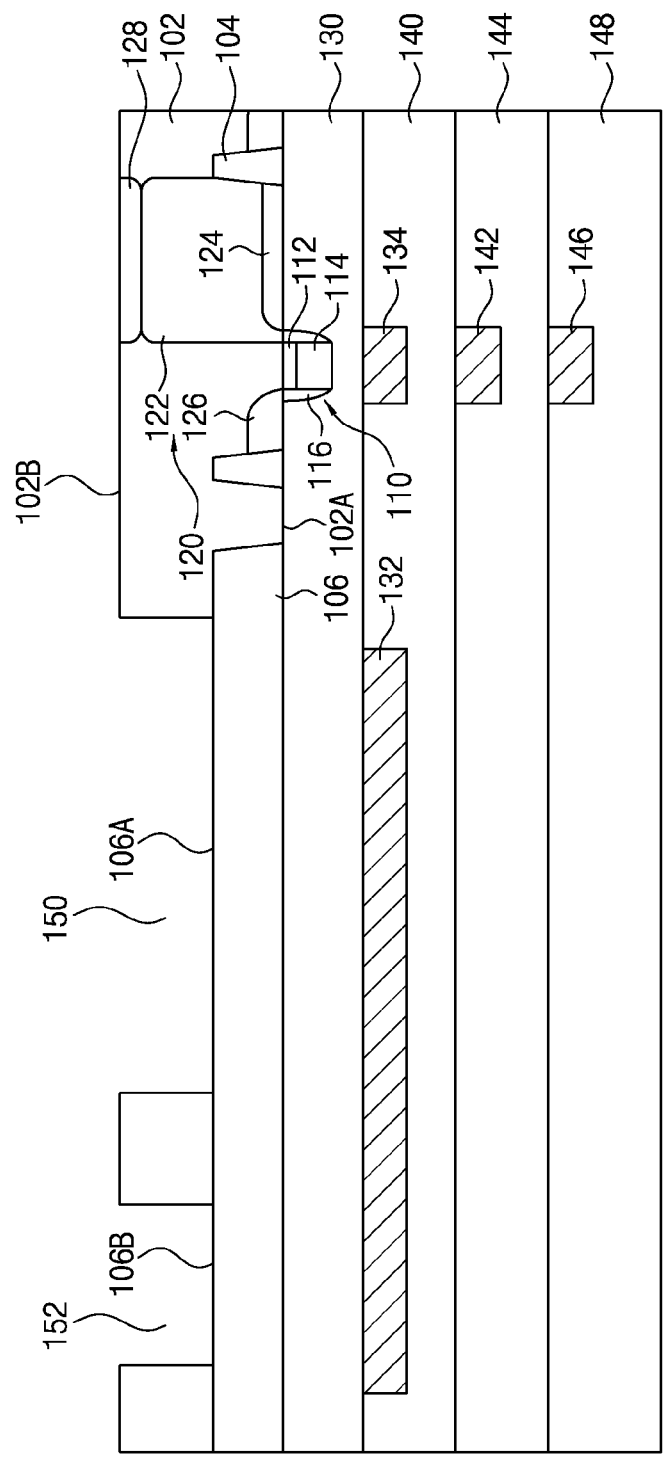

Referring to FIG. 8, the substrate 102 may be partially removed so as to form a first recess 150 and a second recess 152 corresponding to the bonding pad 132 in backside surface portions of the substrate 102. For example, a first photoresist pattern (not shown) may be formed on the backside surface 102B of the substrate 102, which exposes portions of the backside surface 102B of the substrate 102 corresponding to the bonding pad 132. The first recess 150 and the second recess 152 may be formed by an anisotropic etching process using the first photoresist pattern as an etching mask. Particularly, a first portion 106A and a second portion 106B of a backside surface of the field plate 106 may be exposed by the first recess 150 and the second recess 152, respectively. The first photoresist pattern may be removed by an ashing or stripping process after forming the first and second recesses 150 and 152.

Figure 9:
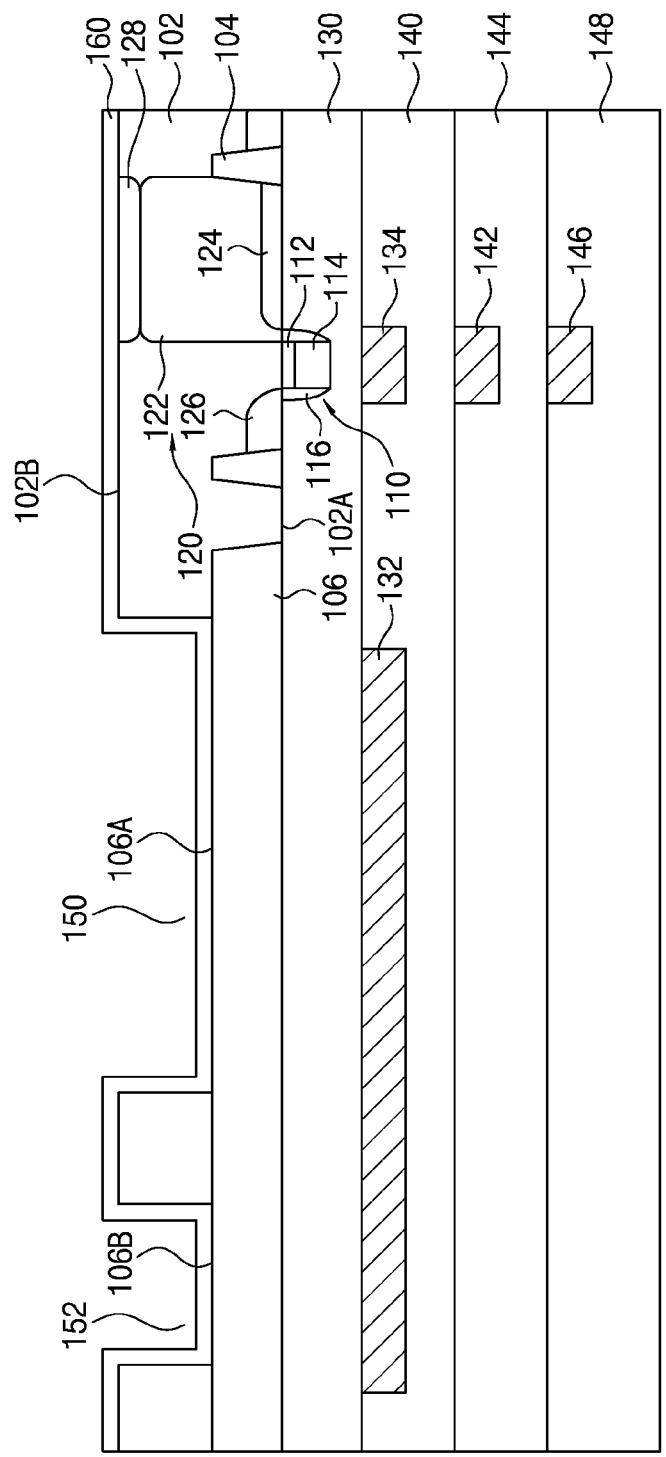

Referring to FIG. 9, an anti-reflective layer 160 may be formed on the backside surface 102B of the substrate 102, a bottom surface (the first portion 106A of the field plate 106) and an inner side surface of the first recess 150, and a bottom surface (the second portion 106B of the field plate 106) and an inner side surface of the second recess 152. For example, a metal oxide layer, a silicon oxide layer and a silicon nitride layer functioning as the anti-reflective layer 160 may be sequentially formed on the backside surface 102B of the substrate 102, the bottom and inner side surfaces of the first recess 150, and the bottom and inner side surfaces of the second recess 152.

Figure 10:
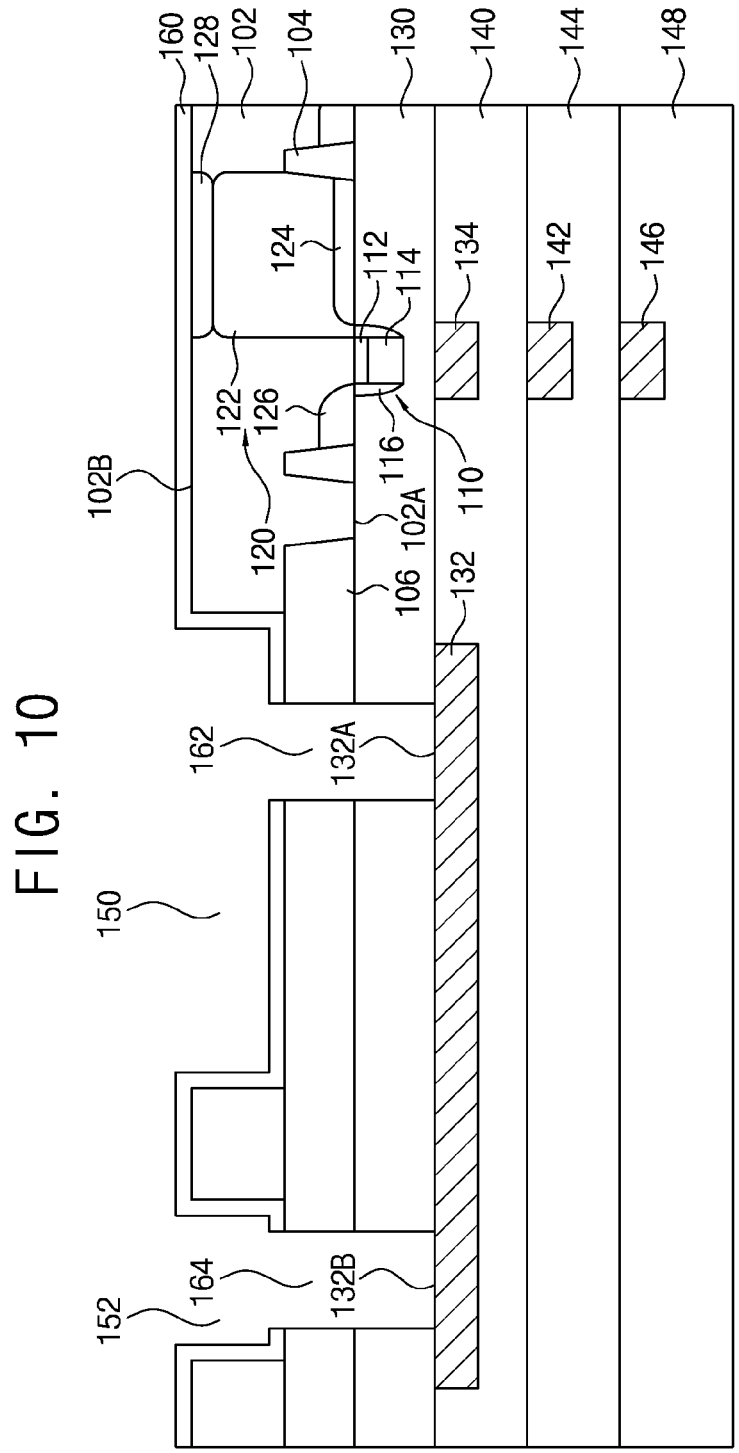

Referring to FIG. 10, a first contact hole 162 and a second contact hole 164 may be formed through the anti-reflective layer 160, the substrate 102 and the insulating layer 130 to expose the bonding pad 132. Specifically, the first contact hole 162 may pass through the anti-reflective layer 160, the first portion 106A of the field plate 106, and the insulating layer 130 so that a first portion 132A of a backside surface of the bonding pad 132 is exposed. Further, the second contact hole 164 may pass through the anti-reflective layer 160, the second portion 106B of the field plate 106, and the insulating layer 130 so that a second portion 132B of the backside surface of the bonding pad 132 is exposed. For example, a second photoresist pattern (not shown) exposing portions of the anti-reflective layer 160 formed on the bottom surfaces of the first and second recesses 150 and 152 may be formed on the anti-reflective layer 160, and the first contact hole 162 and the second contact hole 164 may then be formed by performing an anisotropic etching process using the second photoresist pattern as an etching mask. The second photoresist pattern may be removed by an ashing or stripping process after forming the first and second contact holes 162 and 164.

Figure 11:
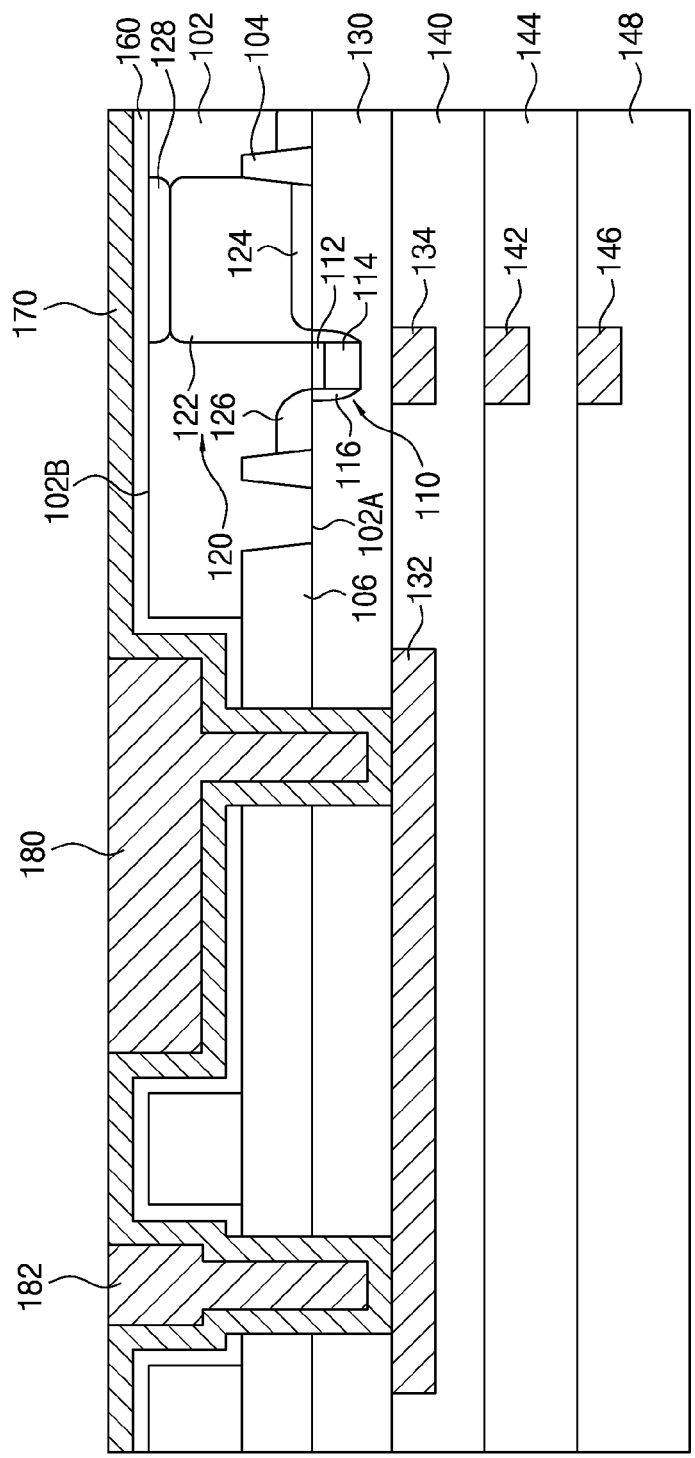

Referring to FIG. 11, a second metal layer 170, e.g., a tungsten layer, may be conformally formed on the anti-reflective layer 160, inner side surfaces of the first and second contact holes 162 and 164, and the first and second portions 132A and 132B of the bonding pad 132.

Then, a third metal layer (not shown), e.g., an aluminum layer, may be formed on the second metal layer 170. Particularly, the third metal layer may be formed such that the first and second recesses 150 and 152, and the first and second contact holes 162 and 164 are sufficiently filled, and then, a third bonding pad 180 and a second test pad 182 may be formed in the first recess 150 and the second recess 152 by partially removing the third metal layer, respectively. For example, after forming the third metal layer, a planarization process such as a chemical mechanical polishing process may be performed so that the second metal layer 170 is exposed, and thus, the third bonding pad 180 and the second test pad 182 may be formed.

Figure 12:
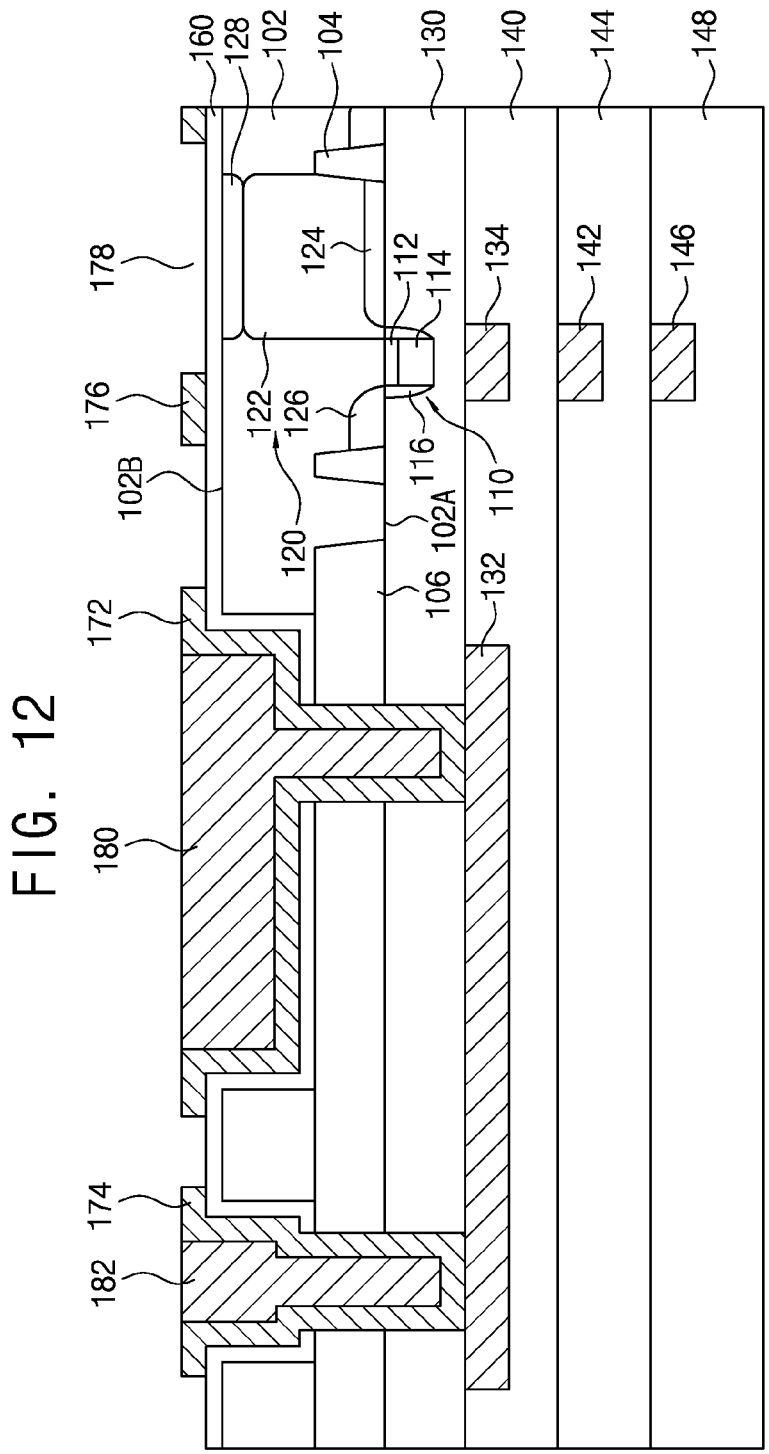

Referring to FIG. 12, by patterning the second metal layer 170, a second bonding pad 172 and a test pad 174 may be formed in the first recess 150 and the second recess 152, respectively. For example, after forming a third photoresist pattern (not shown) on the second metal layer 170, the second bonding pad 172 and the test pad 174 may be formed by performing an anisotropic etching process using the third photoresist pattern as an etching mask. Further, by patterning the second metal layer 170, a light-blocking pattern layer 176 having openings 178 respectively corresponding to the pixel regions 120 may be formed. That is, the second bonding pad 172, the test pad 174, and the light-blocking pattern layer 176 may be simultaneously formed of the same material. The third photoresist pattern may be removed by an ashing or stripping process after forming the second bonding pad 172, the test pad 174, and the light-blocking pattern layer 176.

Meanwhile, when the depth of the first contact hole 162 and the second contact hole 164 is insufficient, the second bonding pad 172 and the test pad 174 may not be electrically connected to the bonding pad 132. That is, when the first and second portions 132A and 132B of the backside surface of the bonding pad 132 are not exposed by the first and second contact holes 162 and 164, the second bonding pad 172 and the test pad 174 may not be electrically connected to the first portion 132A and the second portion 132B of the bonding pad 132. In such case, an electrical resistance between the third bonding pad 180 and the second test pad 182 may be measured to be relatively high in a test process using a probe card.

Referring again to FIG. 1, a color filter layer 190 and a microlens array 192 may be sequentially formed on the anti-reflective layer 160 and the light-blocking pattern layer 176, and further, solder bumps 200 may be formed on the third bonding pads 180.

FIGS. 13 to 19 are cross-sectional views illustrating a method of manufacturing the backside illuminated image sensor as shown in FIG. 2.

Figure 13:
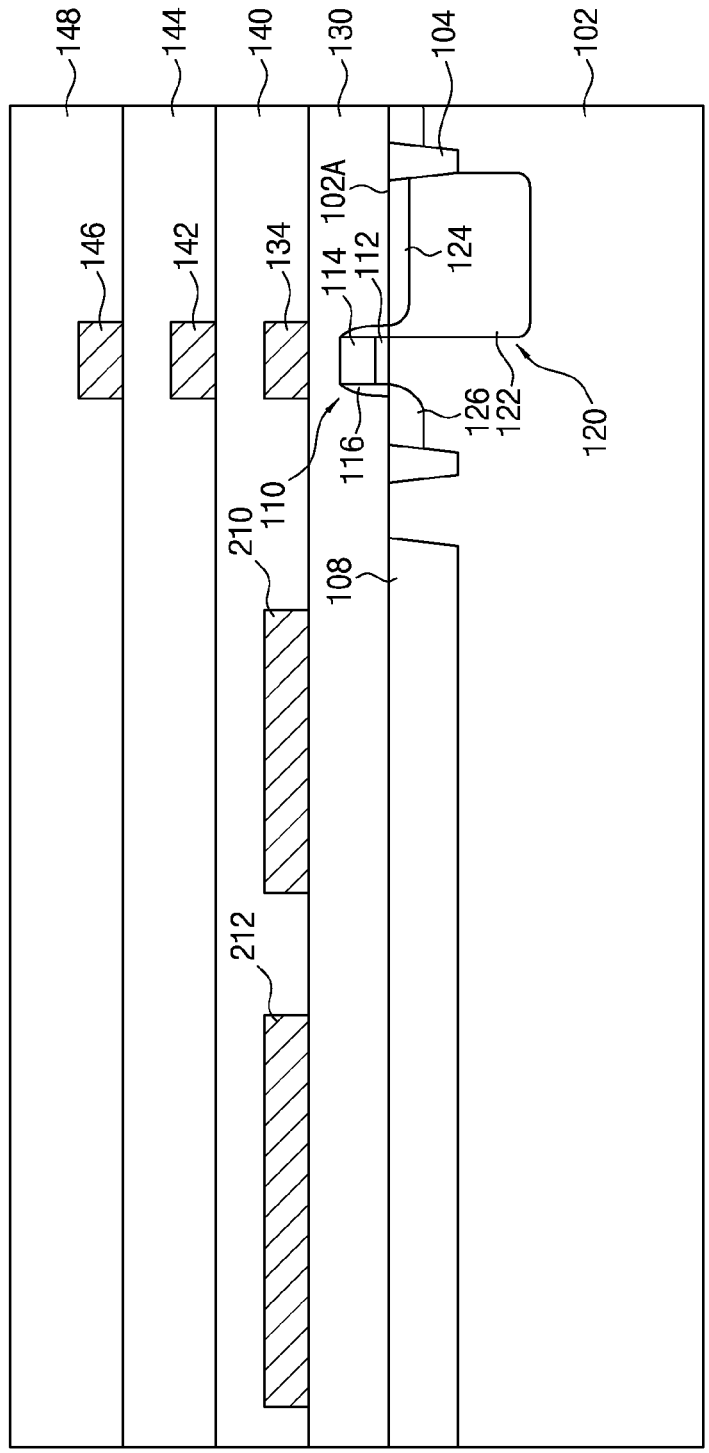
FIGS. 13 to 19 are cross-sectional views illustrating a method of manufacturing the backside illuminated image sensor as shown in FIG. 2.

Referring to FIG. 13, device isolation regions 104 and a field plate 108 may be formed in frontside surface portions of a substrate 102, and pixel regions 120 may be formed in the substrate 102. Further, an insulating layer 130 may be formed on a frontside surface 102A of the substrate 102, and a bonding pad 210, a test pad 212, and a first wiring layer 134 may be formed on the insulating layer 130. For example, the bonding pad 210, the test pad 212, and the first wiring layer 134 may be formed by forming a metal layer such as an aluminum layer on the insulating layer 130 and then patterning the metal layer. Then, a second insulating layer 140, a second wiring layer 142, a third insulating layer 144, a third wiring layer 146, and a passivation layer 148 may be sequentially formed.

Figure 14:
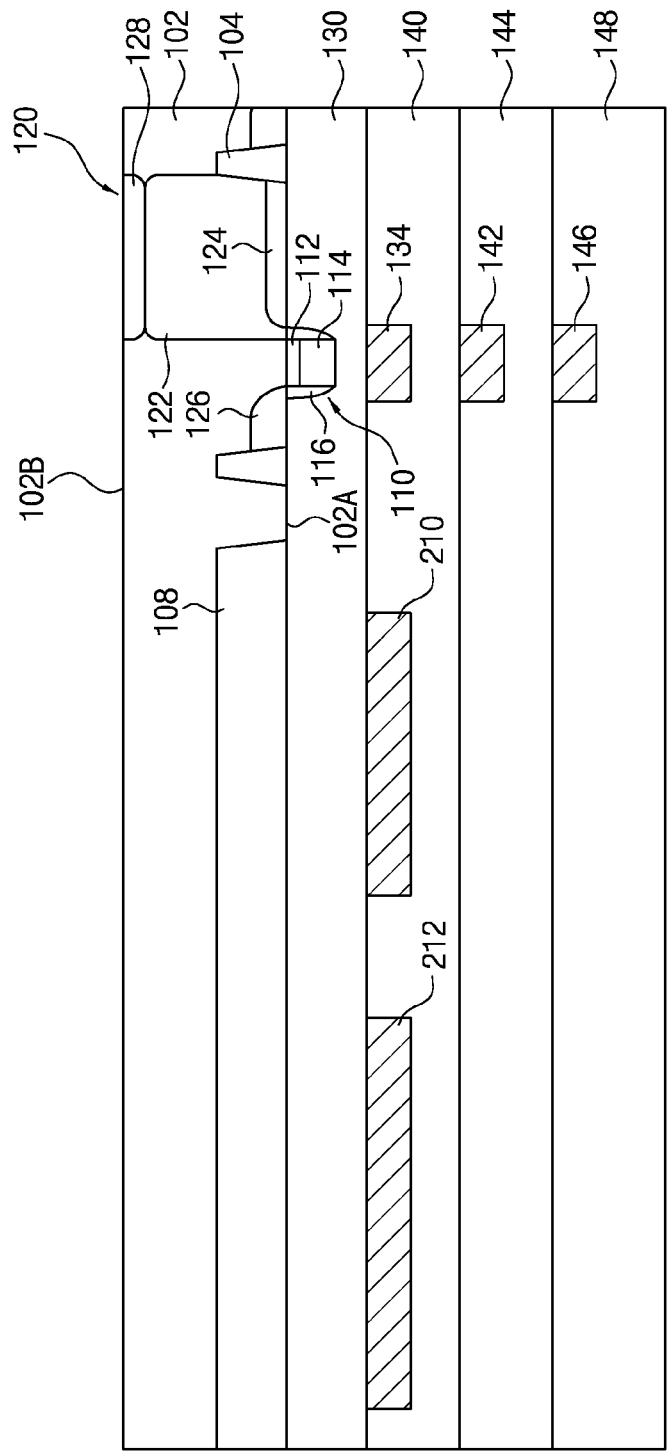

Referring to FIG. 14, a back-grinding process and/or a chemical mechanical polishing process may be performed in order to reduce a thickness of the substrate 102. Further, backside pinning layers 128 having the first conductivity type may be formed between a backside surface 102B of the substrate 102 and the charge accumulation regions 122.

Figure 15:
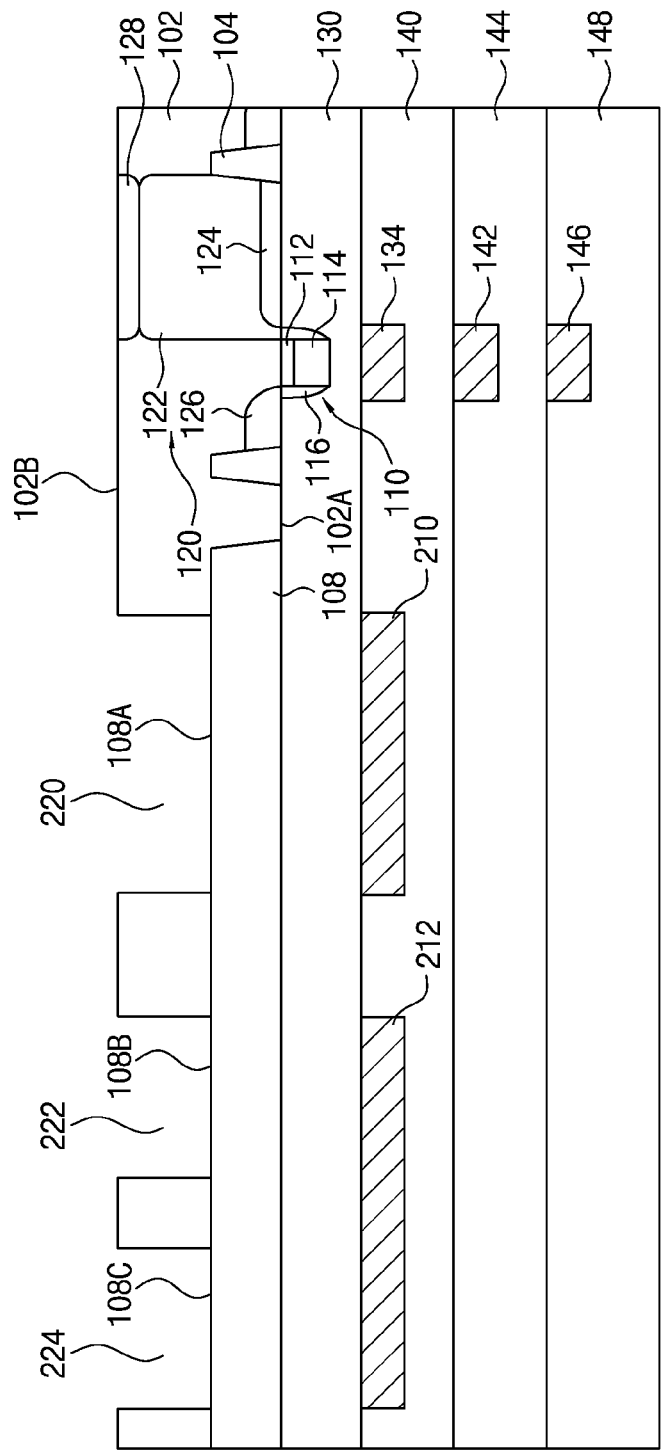

Referring to FIG. 15, the substrate 102 may be partially removed so as to form a first recess 220 corresponding to the bonding pad 210, and a second recess 222 and a third recess 224 corresponding to the test pad 212 in backside surface portions of the substrate 102. For example, a first photoresist pattern (not shown) may be formed on the backside surface 102B of the substrate 102, which exposes portions of the backside surface 102B of the substrate 102 corresponding to the bonding pad 210 and the test pad 212. The first recess 220, the second recess 222, and the third recess 224 may be formed by an anisotropic etching process using the first photoresist pattern as an etching mask. Particularly, a first portion 108A, a second portion 108B, and a third portion 108C of a backside surface of the field plate 108 may be exposed by the first recess 220, the second recess 222, and the third recess 224, respectively. The first photoresist pattern may be removed by an ashing or stripping process after forming the first, second and third recesses 220, 222 and 224.

Figure 16:
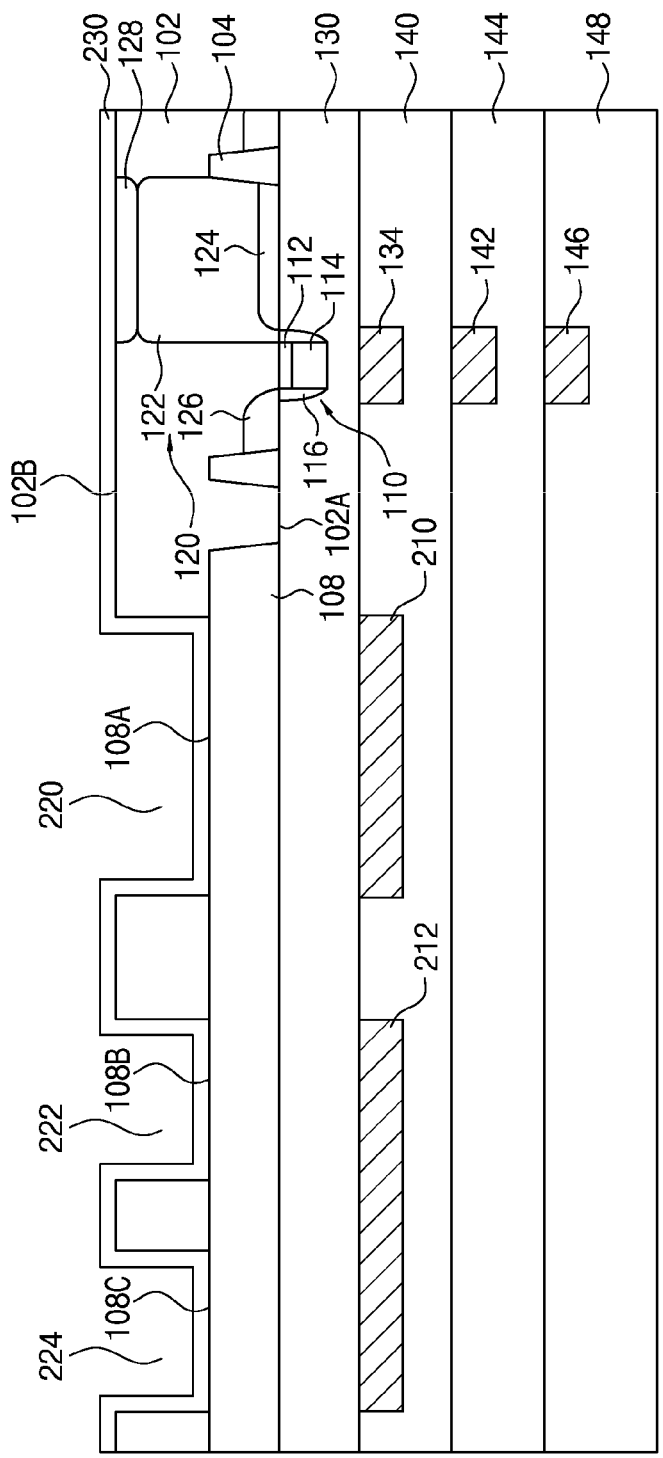

Referring to FIG. 16, an anti-reflective layer 230 may be formed on the backside surface 102B of the substrate 102, a bottom surface (the first portion 108A of the field plate 108) and an inner side surface of the first recess 220, a bottom surface (the second portion 108B of the field plate 108) and an inner side surface of the second recess 222, and a bottom surface (the third portion 108C of the field plate 108) and an inner side surface of the second recess 224.

Figure 17:
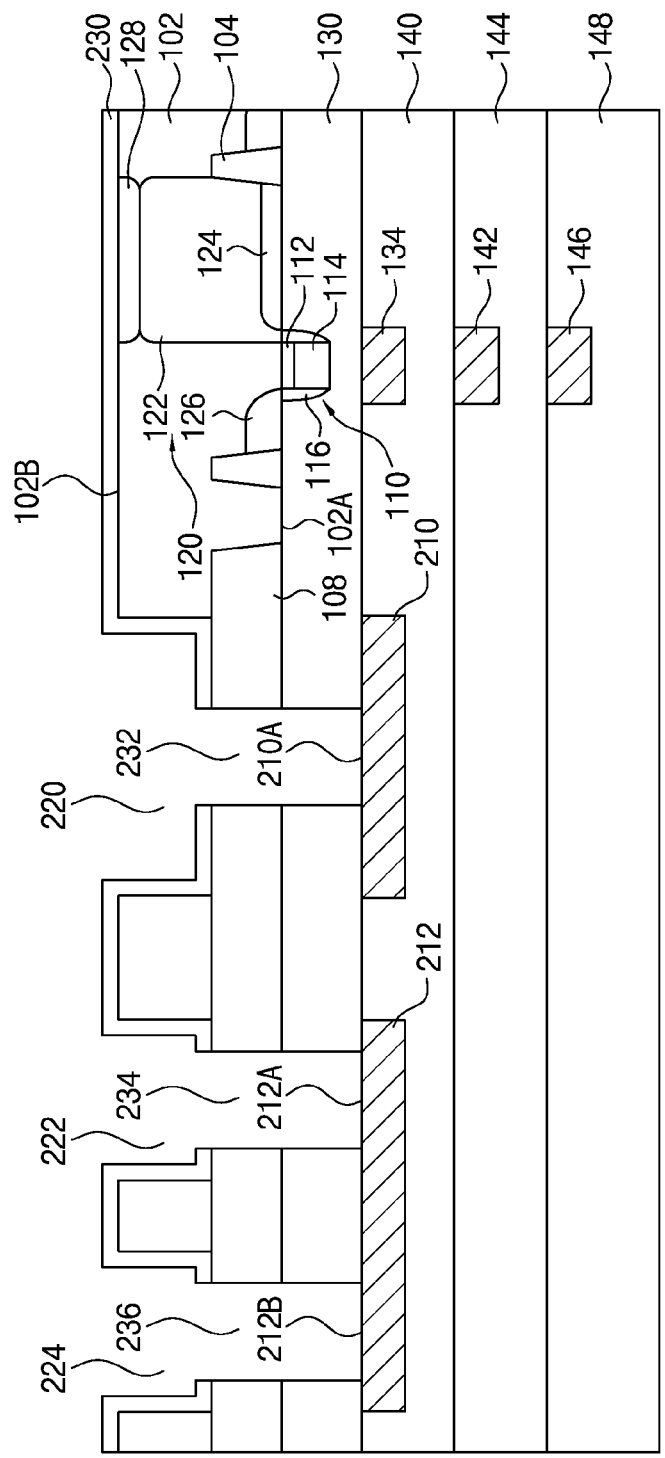

Referring to FIG. 17, a first contact hole 232 may be formed through the anti-reflective layer 230, the substrate 102 and the insulating layer 130 to expose the bonding pad 210. Further, a second contact hole 234 and a third contact hole 236 may be formed through the anti-reflective layer 230, the substrate 102 and the insulating layer 130 to expose the test pad 212. Specifically, the first contact hole 232 may pass through the anti-reflective layer 230, the first portion 108A of the field plate 108, and the insulating layer 130 so that a portion 210A of a backside surface of the bonding pad 210 is exposed. Further, the second contact hole 234 may pass through the anti-reflective layer 230, the second portion 108B of the field plate 108, and the insulating layer 130 so that a first portion 212A of the backside surface of the test pad 212 is exposed, and the third contact hole 236 may pass through the anti-reflective layer 230, the second portion 108C of the field plate 108, and the insulating layer 130 so that a second portion 212B of the backside surface of the test pad 212 is exposed. For example, after forming a second photoresist pattern (not shown) on the anti-reflective layer 230, and the first contact hole 232, the second contact hole 234, the third contact hole 236 may be formed by performing an anisotropic etching process using the second photoresist pattern as an etching mask. The second photoresist pattern may be removed by an ashing or stripping process after forming the first, second and third contact holes 232, 234 and 236, respectively.

Figure 18:
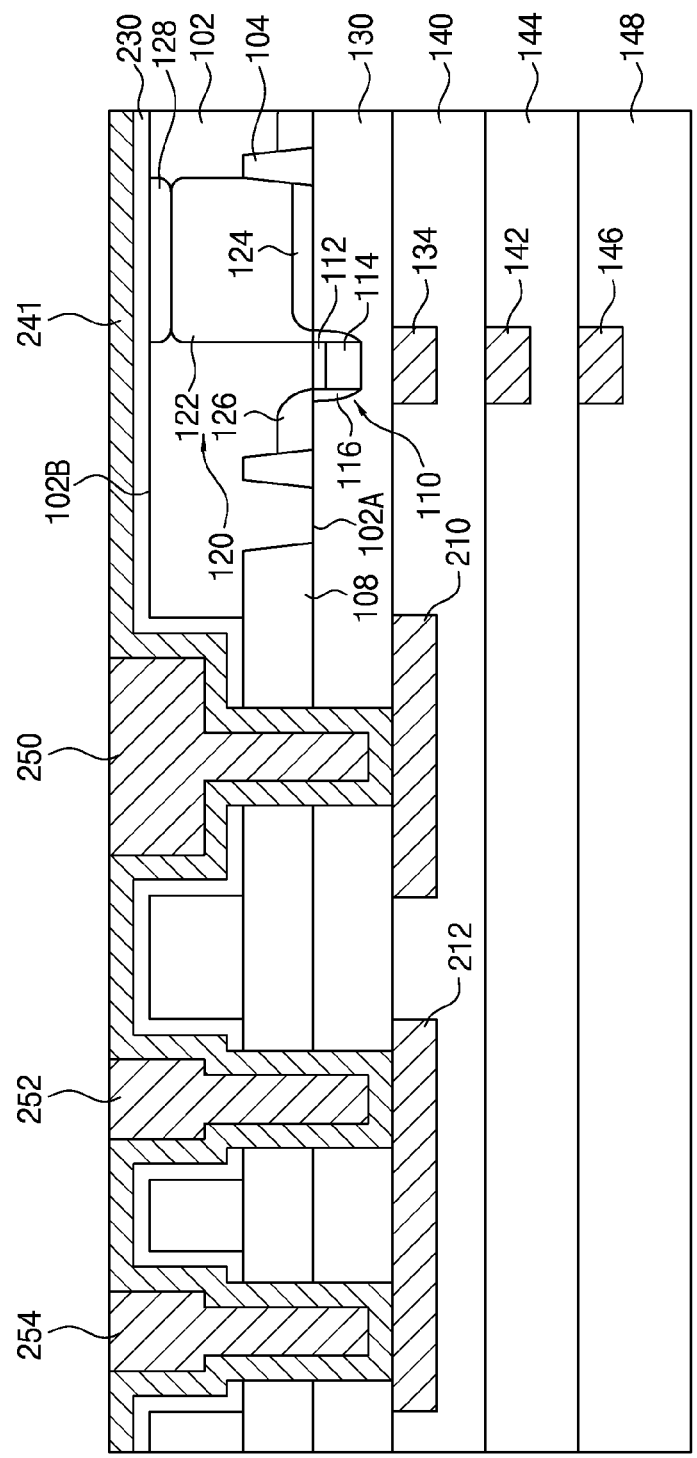

Referring to FIG. 18, a second metal layer 241, e.g., a tungsten layer, may be conformally formed on the anti-reflective layer 230, inner side surfaces of the first, second and third contact holes 232, 234 and 236, the exposed portion 210A of the bonding pad 210, and the exposed first and second portions 212A and 212B of the test pad 212.

Then, a third metal layer (not shown), e.g., an aluminum layer, may be formed on the second metal layer 241. Particularly, the third metal layer may be formed such that the first, second and third recesses 220, 222 and 224, and the first, second and third contact holes 232, 234 and 236 are sufficiently filled, and then, a third bonding pad 250, a fourth test pad 252 and a fifth test pad 254 may be formed in the first recess 220, the second recess 222 and the third recess 224 by partially removing the third metal layer, respectively. For example, after forming the third metal layer, a planarization process such as a chemical mechanical polishing process may be performed so that the second metal layer 241 is exposed, and thus, the third bonding pad 250, the fourth test pad 252 and the fifth test pad 254 may be formed.

Figure 19:
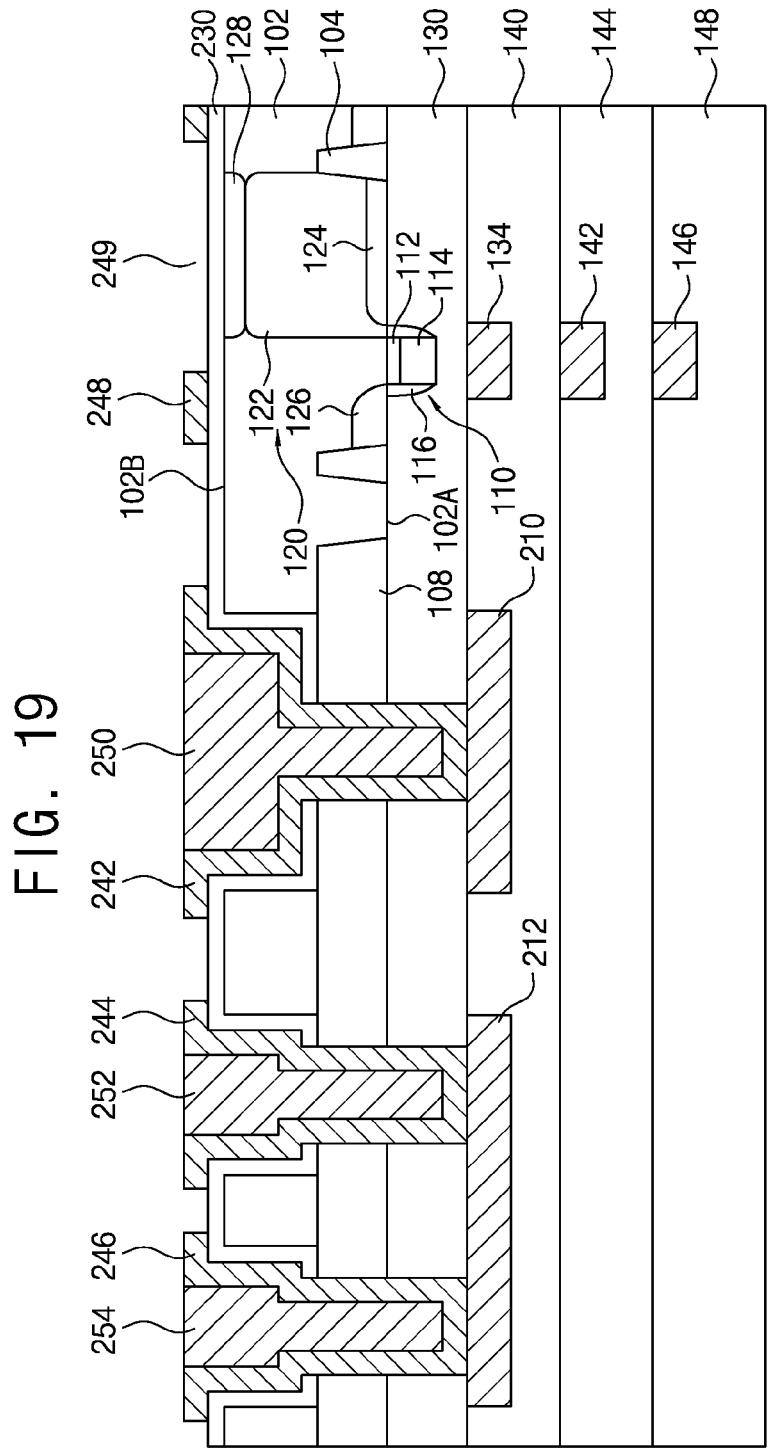

Referring to FIG. 19, by patterning the second metal layer 241, a second bonding pad 242, a second test pad 244 and a third test pad 246 may be formed in the first recess 220, the second recess 222 and the third recess 224, respectively. For example, after forming a third photoresist pattern (not shown) on the second metal layer 241, the second bonding pad 242, the second test pad 244 and the third test pad 246 may be formed by performing an anisotropic etching process using the third photoresist pattern as an etching mask. Further, by patterning the second metal layer 241, a light-blocking pattern layer 248 having openings 249 respectively corresponding to the pixel regions 120 may be formed. That is, the second bonding pad 242, the second test pad 244, the third test pad 246 and the light-blocking pattern layer 248 may be simultaneously formed of the same material. The third photoresist pattern may be removed by an ashing or stripping process after forming the second bonding pad 242, the second test pad 244, the third test pad 246 and the light-blocking pattern layer 248.

Meanwhile, when the depth of the first contact hole 232, the second contact hole 234 and the third contact hole 236 is insufficient, the second bonding pad 242 may not be electrically connected to the bonding pad 210, and the second and third test pads 244 and 246 may not be electrically connected to the test pad 212. In such case, an electrical resistance between the fourth test pad 252 and the fifth test pad 254 may be measured to be relatively high in a test process using a probe card.

Referring again to FIG. 2, a color filter layer 260 and a microlens array 262 may be sequentially formed on the anti-reflective layer 230 and the light-blocking pattern layer 248, and further, solder bumps 270 may be formed on the third bonding pads 250.

Although the example embodiments of the present invention have been described with reference to the specific embodiments, they are not limited thereto. Therefore, it will be readily understood by those skilled in the art that various modifications and changes can be made thereto without departing from the spirit and scope of the present disclosure defined by the appended claims.

The invention claimed is:

1. A backside illuminated image sensor comprising:
a substrate having a frontside surface and a backside surface;
pixel regions disposed in the substrate;
an insulating layer disposed on the frontside surface of the substrate;
a bonding pad disposed on a frontside surface of the insulating layer;
a second bonding pad connected to a backside surface of the bonding pad through the substrate and the insulating layer and exposed through the backside surface of the substrate; and
a test pad structure for testing whether the second bonding pad is normally connected to the backside surface of the bonding pad,
wherein the test pad structure comprises:
a test pad disposed on the frontside surface of the insulating layer;
a second test pad connected to a backside surface of the test pad through the substrate and the insulating layer and exposed through the backside surface of the substrate; and
a third test pad connected to the backside surface of the test pad through the substrate and the insulating layer and exposed through the backside surface of the substrate.

2. The backside illuminated image sensor of claim 1, wherein the substrate has a first recess, a second recess and a third recess formed in backside surface portions of the substrate,
the second bonding pad is connected to the backside surface of the bonding pad through a bottom surface portion of the first recess,
the second test pad is connected to the backside surface of the test pad through a bottom surface portion of the second recess, and
the third test pad is connected to the backside surface of the test pad through a bottom surface portion of the third recess.

3. The backside illuminated image sensor of claim 2, further comprising:
an anti-reflective layer formed on the backside surface of the substrate, a bottom surface and an inner side surface of the first recess, a bottom surface and an inner side surface of the second recess, and a bottom surface and an inner side surface of the third recess.

4. The backside illuminated image sensor of claim 3, wherein the second bonding pad is connected to the bonding pad through a first contact hole exposing a portion of the backside surface of the bonding pad through the anti-reflective layer, the substrate, and the insulating layer,
the second test pad is connected to the test pad through a second contact hole exposing a first portion of the backside surface of the test pad through the anti-reflective layer, the substrate, and the insulating layer, and
the third test pad is connected to the test pad through a third contact hole exposing a second portion of the backside surface of the test pad through the anti-reflective layer, the substrate, and the insulating layer.

5. The backside illuminated image sensor of claim 4, wherein the second bonding pad is formed with a predetermined constant thickness on the anti-reflective layer, an inner side surface of the first contact hole, and the portion of the backside surface of the bonding pad,
the second test pad is formed with a predetermined constant thickness on the anti-reflective layer, an inner side surface of the second contact hole, and the first portion of the backside surface of the test pad, and
the third test pad is formed with a predetermined constant thickness on the anti-reflective layer, an inner side surface of the third contact hole, and the second portion of the backside surface of the test pad.

6. The backside illuminated image sensor of claim 5, further comprising:
a third bonding pad formed in the second bonding pad;
a fourth test pad formed in the second test pad; and
a fifth test pad formed in the third test pad.

7. The backside illuminated image sensor of claim 5, wherein the thickness of the second test pad and the thickness of the third test pad are a same as the thickness of the second bonding pad.

8. The backside illuminated image sensor of claim 5, further comprising:
a light-blocking pattern layer formed on the anti-reflective layer and having openings corresponding to the pixel regions, respectively,
wherein the light-blocking pattern layer has a same thickness as the second bonding pad.

9. The backside illuminated image sensor of claim 8, further comprising:
a third bonding pad formed on the second bonding pad to fill an inside of the second bonding pad;
a fourth test pad formed on the second test pad to fill an inside of the second test pad; and
a fifth test pad formed on the third test pad to fill an inside of the third test pad,
wherein, when the backside surface of the substrate faces upward, an upper surface of the third bonding pad, an upper surface of the fourth test pad, and an upper surface of the fifth test pad have a same height as an upper surface of the light-blocking pattern layer.

10. The backside illuminated image sensor of claim 1, wherein the substrate comprises a field plate formed in a front surface portion of the substrate and made of an insulating material, and has a first recess, a second recess and a third recess formed in backside surface portions of the substrate and exposing a first portion, a second portion and a third portion of a backside surface of the field plate, respectively,
the second bonding pad passes through the first portion of the backside surface of the field plate and is connected to the backside surface of the bonding pad, and
the second test pad and the third test pad pass through the second portion and the third portion of the backside surface of the field plate, respectively, and are connected to the backside surface of the test pad.

* * * * *